US006994747B2

(12) United States Patent
Hiraiwa et al.

(10) Patent No.: US 6,994,747 B2
(45) Date of Patent: Feb. 7, 2006

(54) METHOD FOR PRODUCING OPTICAL MEMBER

(75) Inventors: Hiroyuki Hiraiwa, Yokohama (JP); Shigeru Sakuma, Chigasaki (JP); Minako Azumi, Kawasaki (JP); Masaaki Mochida, Yamato (JP)

(73) Assignee: Nikon Corporation, Tokyo (JP)

( * ) Notice: Subject to any disclaimer, the term of this patent is extended or adjusted under 35 U.S.C. 154(b) by 157 days.

(21) Appl. No.: 10/471,997

(22) PCT Filed: Jul. 17, 2002

(86) PCT No.: PCT/JP02/07278

§ 371 (c)(1),
(2), (4) Date: Sep. 16, 2003

(87) PCT Pub. No.: WO03/009017

PCT Pub. Date: Jan. 30, 2003

(65) Prior Publication Data

US 2004/0089023 A1    May 13, 2004

(30) Foreign Application Priority Data

Jul. 17, 2001  (JP) .......................... P2001-217275

(51) Int. Cl.
*C30B 15/00*    (2006.01)

(52) U.S. Cl. ........................................ 117/13; 117/902

(58) Field of Classification Search .................. 117/13, 117/902; 438/973, 975
See application file for complete search history.

(56) References Cited

U.S. PATENT DOCUMENTS

| 4,915,774 | A  | 4/1990 | Schiller et al. |
| 5,034,949 | A  | 7/1991 | Gunter |
| 6,088,171 | A  | 7/2000 | Kudo .......................... 359/754 |
| 6,201,634 | B1 | 3/2001 | Sakuma et al. |

FOREIGN PATENT DOCUMENTS

| JP | A 04-294320   | 10/1992 |
| JP | A 08-107060   | 4/1996 |
| JP | A 08-220301   | 8/1996 |
| JP | A 11-21197    | 1/1999 |
| JP | A 11-54411    | 2/1999 |
| JP | A 2000-203994 | 7/2000 |

*Primary Examiner*—Felisa C. Hiteshew
(74) *Attorney, Agent, or Firm*—Oliff & Berridge PLC

(57) ABSTRACT

An optical member manufacturing method of the present invention has a growth step of growing an ingot of a fluoride crystal, a plane orientation measurement step of measuring two or more crystal plane orientations of the ingot, a cutout step of cutting out an optical material from the ingot along any one of the crystal plane orientations obtained in the plane orientation measurement step, and a machining step of performing predetermined machining processing on the optical material to obtain an optical member.

16 Claims, 17 Drawing Sheets

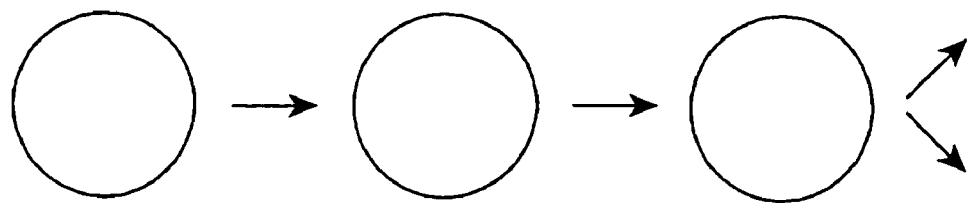
*Fig.10A*  *Fig.10B*  *Fig.10C*
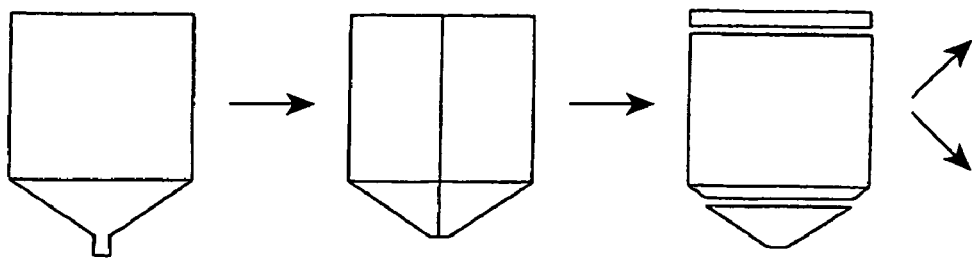
*Fig.11A*  *Fig.11B*  *Fig.11C*
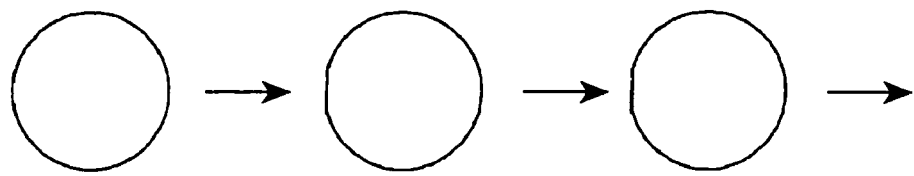
*Fig.12A*  *Fig.12B*  *Fig.12C*
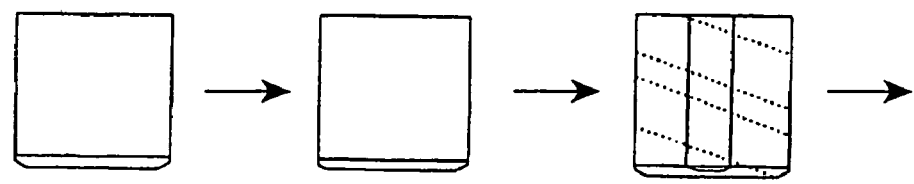
*Fig.13A*  *Fig.13B*  *Fig.13C*

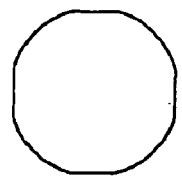  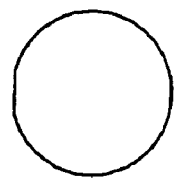 
Fig.14A   Fig.14B
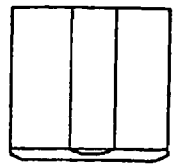  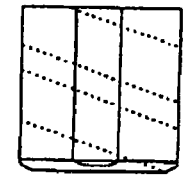 
Fig.15A   Fig.15B
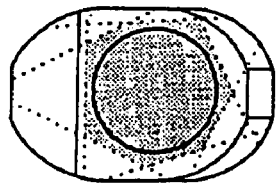  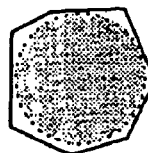 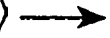 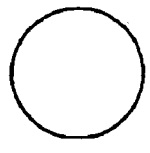
Fig.16A   Fig.16B   Fig.16C
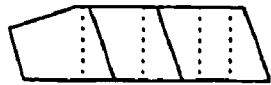    
Fig.17A   Fig.17B   Fig.17C

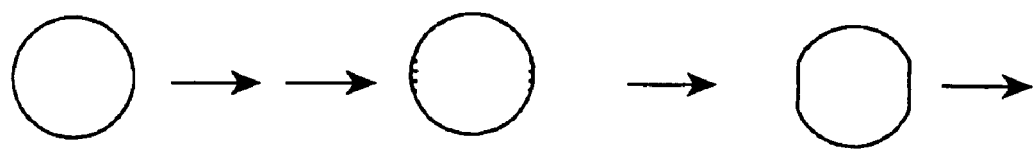
*Fig.18A*     *Fig.18B*     *Fig.18C*
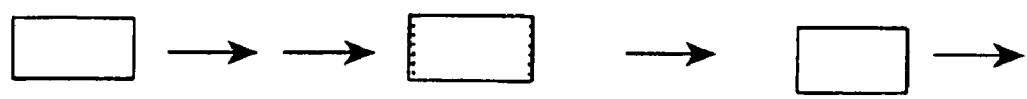
*Fig.19A*     *Fig.19B*     *Fig.19C*

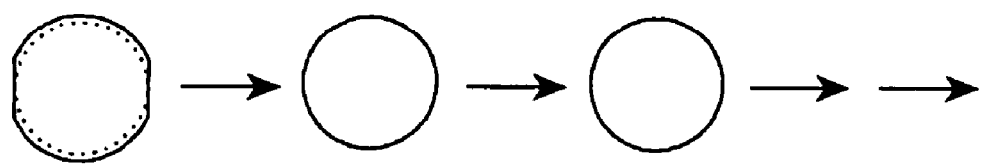
*Fig.20A*  *Fig.20B*  *Fig.20C*
*Fig.21A*  *Fig.21B*  *Fig.21C*

METHOD FOR PRODUCING OPTICAL MEMBER

TECHNICAL FIELD

The present invention relates to a method of manufacturing an optical member made of a fluoride crystal, and more specifically, to a method of manufacturing an optical member for use in an optical device including a camera, a microscope, and a telescope, and in an optical system in a photolithography system including a stepper, and the like.

BACKGROUND ART

In recent years, lithographic technologies for printing integrated circuit patterns on wafers have rapidly been developing. Demand for higher integration densities in integrated circuits has been increased than ever. In order to achieve a higher integration density, it is necessary to improve the resolution of a projection optical system in a projection exposure system. The resolution of a projection lens is dominated by the wavelength of light used therein and the numerical aperture (NA) of the projection lens. In order to improve the resolution, the wavelength of the light to be used is shortened, and the NA of the projection optical system is enlarged (enlargement of aperture).

Wavelengths of light for use in projection exposure systems have been already shortened to g-line (wavelength: 436 nm) or i-line (wavelength: 365 nm). The use of KrF excimer laser light (wavelength: 248 nm), ArF excimer laser light (wavelength: 193 nm), and the like, which have yet shorter wavelengths, has been also examined. As wavelengths of light have been further shortened as described above, multicomponent optical glass, which is commonly used in imaging optical systems such as projection optical systems, cannot be used as material for lenses any longer in terms of transmittance deterioration. Therefore, in optical systems for excimer laser steppers, using quartz glass or fluoride crystals (for example, calcium fluoride (fluorite)) as optical members is common.

It is said that crystal material is preferably a single crystal in order to satisfy optical performance as of an optical member for use in an optical system of an excimer laser stepper. Furthermore, along with the trend toward higher performance of projection exposure systems, calcium fluoride single crystals having a large aperture of approximately φ120 mm to φ350 mm are desired in recent years. A calcium fluoride (fluorite) single crystal has a lower refractive index and a smaller dispersion (wavelength dependency of refractive index) than those of general optical glass, and therefore is very effective in that chromatic aberration can be compensated when used together with an optical member made of other material. Moreover, calcium fluoride single crystals are more available than other fluoride crystals (barium fluoride and the like) in the market, and a large aperture single crystal having a diameter of φ120 mm or more is also available.

Calcium fluoride single crystals having these advantages have been conventionally used as material for lenses of cameras and telescopes in addition to optical material for steppers. Moreover, recently, other than calcium fluoride single crystals, single crystals of barium fluoride and strontium fluoride, which are fluoride single crystals, also belong to the isometric system and are drawing attention as next-generation optical material because of their similar properties.

As a crystal growth method for a fluoride single crystal, a number of melt methods including the Bridgeman method (the Stockbarger method, or the pulling down method) and the Tammann has been known. Herein, it is considered that the growth direction of a fluoride crystal manufactured by the Bridgeman method or the like has no significance. Actually, the horizontal surfaces of obtained ingots show random crystal plane orientations every time a crystal is grown.

After crystal growth, since large residual stresses exist in a taken out ingot, simple heat treatment is usually performed on the ingot as it is. Subsequently, the ingot is cut into appropriate sizes depending on a desired product, and heat treatment for obtaining desired optical performance (homogeneity of refractive index, birefringence, and the like) is performed on the cut-out materials.

In the case where crystal plane directions are not considered, the ingot is cut horizontally (sliced in rounds), thus making it possible to effectively cut out larger materials for fabricating optical elements (lenses or the like) from the ingot.

Moreover, it has been known that the {111} planes of a fluoride single crystal have higher optical performance than that of other crystal planes in the perpendicular direction. Accordingly, in order to obtain a fluoride single crystal having high optical performance, the following method may be adopted. Specifically, in the method, the {111} planes of a fluoride single crystal ingot are measured, a material for fabricating an optical element is cut out so that the {111} planes constitute two parallel flat surfaces, and then heat treatment is performed. Alternatively, the following method may be adopted. Specifically, in the method, heat treatment is performed on an ingot of a fluoride single crystal obtained by crystal growth, and then a material for fabricating an optical element is cut out so that two opposite flat surfaces become {111} planes.

Incidentally, birefringence is a phenomenon in which a refractive index varies depending on the polarization direction of light (electromagnetic wave). In general, birefringence is expressed as an optical path difference (called retardation) when light transmits through a unit length of a substance, and nm/cm is used as a unit thereof. Further, in the case where birefringence is caused by strain, this birefringence is often called strain.

Heretofore, it has been considered that a single crystal in the isometric system, such as calcium fluoride, has no intrinsic birefringence. Further, in the case of a single crystal of calcium fluoride, it has been considered that, even if birefringence is induced by thermal stresses generated in a manufacturing process, the birefringence can be reduced to a level where it does not adversely affect optical design. Actually, for light having a relatively longer wavelength of 633 nm, the value of birefringence has been able to be reduced to approximately 1 to 2 nm/cm by performing predetermined heat treatment.

Under this background, as a method of cutting out optical materials from an ingot, a method in which a phenomenon of crystal cleavage is utilized and the orientation of {111} planes is simply determined has been common. Further, in the case where an optical system is assembled using optical members obtained from the optical materials, the optical members have been arranged in such a manner that the normal of {111} planes is aligned with the optical axis. However, birefringence in crystal plane orientations other than {111} planes has not been considered.

DISCLOSURE OF THE INVENTION

However, by recent research, it has been made clear that, in a single crystal of calcium fluoride, even if stresses due to thermal stresses are removed completely, intrinsic birefringence of a calcium fluoride single crystal occurs depending on crystal plane orientations. This intrinsic birefringence increases as the wavelength of light to be used becomes shorter. For example, as the wavelength is sequentially set to 633 nm, 193 nm, and 157 nm to be varied in the shortening direction, birefringence of light transmitting in the normal direction of {110} planes becomes 0.2 nm/cm or less, 3.4 nm/cm, 11.2 nm/cm.

Further, in an optical member manufactured by cutting out from a fluoride single crystal ingot a material for fabricating an optical element using a heretofore-known method, intrinsic birefringence of a fluoride single crystal tends to constitute a problem when the optical member is used together with light having a short wavelength. Particularly in the case of an optical system or the like of a stepper which includes a plurality of optical members, the influence of the intrinsic birefringence accumulated over the entire optical system, thus increasing aberration and deteriorating imaging performance or the like.

Therefore, the present situation is that optical members capable of withstanding being used together with light having a short wavelength are selected and applied to an optical system. However, obtaining sufficient imaging performance is not always easy. Moreover, such optical members can be fabricated in a very small quantity from optical elements according to a heretofore-known method, and thus there are many problems to be overcome in terms of yield in a manufacturing process.

The present invention is made in view of the above-described problems, and has an objective to provide an optical member manufacturing method in which the influence of birefringence can be sufficiently reduced by controlling crystal plane orientations.

As a result of a series of assiduous research intended to achieve the above-described object, the present inventors came to achieve the present invention by discovering that an optical member capable of reducing the influence of birefringence can be easily and certainly obtained by measuring two or more crystal plane orientations of a fluoride crystal ingot to cut out an optical material from the ingot along any one of these crystal plane orientations.

Specifically, an optical member manufacturing method of the present invention includes a growth step of growing an ingot of a fluoride crystal, a plane orientation measurement step of measuring two or more crystal plane orientations of the ingot, a cutout step of cutting out an optical material from the ingot along any one of the crystal plane orientations obtained in the plane orientation measurement process, and a machining step of performing predetermined machining processing on the optical material to obtain an optical member.

Incidentally, in the present invention, an optical material means a semifinished product after cut out from an ingot, and an optical member means a final product (lens or the like) after machining processing and, in some cases, also heat treatment.

In the present invention, Miller indices are used for indicating a crystal plane orientation. Miller indices are the reciprocals each of which is the ratio of the distance between the origin of a unit lattice of a crystal and the intersection of a plane and each crystal axis to the unit length of the crystal axis. In the case of the cubic system such as calcium fluoride, a predetermined crystal plane is represented by (hkl) using Miller indices, where the unit length for each crystal axis is a, and where the distances from the origin to the intersections between the crystal plane and the respective crystal axes are a/h, a/k, and a/l.

Here, in the cubic system, the orientation [hkl] is always perpendicular to (hkl) planes having the same indices. Accordingly, orientations in a symmetric relationship are represented by one set of indices and indicated by <hkl>. Further, equivalent lattice planes in a symmetric relationship are also represented by one set of indices and indicated by {hkl}. For example, all diagonals of a cube, which are the [111], [1-11], [-1-11], and [-111] axes, are represented by the <111> axis. The surfaces of a cube, which are the (100), (010), (-100), (0-10), (001), and (00-1) planes, are represented by the {100} plane. The axes of a fluoride single crystal being a cubic crystal ([100], [010], [001], [110], [101], [011], and [111] axes) are shown in FIG. 1.

Note that measurement of crystal plane orientations is equivalent to measurement of crystal axes. For example, measuring the {111} plane orientation is equivalent to measuring the <111> axis.

For example, in the case of calcium fluoride, in an optical member using the {111} plane as a basis, three peaks of birefringence (birefringence symmetry axis <111>) exist in rotational directions of 120° around the <111> axis. By fabricating an optical system in such a manner that the optical axis of this optical member is aligned with the optical axis of an optical member rotated around the <111> axis by 60° (FIG. 2B), these two optical members are arranged so that the <110> axes may not overlap each other. Accordingly, the influence of intrinsic birefringence of a fluoride crystal can be sufficiently reduced.

Moreover, as shown in FIG. 3A, in an optical member using the {100} plane as a basis, four peaks of birefringence (birefringence symmetry axis <110>) exist in rotational directions of 90° around the <100> axis. By fabricating an optical system in such a manner that the optical axis of this optical member is aligned with the optical axis of an optical member rotated around the <100> axis by 45° (FIG. 3B), these two optical members are arranged so that the <110> axes may not overlap each other. Accordingly, also in this case, the influence of intrinsic birefringence of a fluoride crystal can be sufficiently reduced.

Furthermore, as shown in FIG. 4A, in an optical member using the {110} plane as a basis, two peaks of birefringence (birefringence symmetry axis <111> and <100>) exist in rotational directions of 90° around the <110> axis. By fabricating an optical system in such a manner that the optical axis of this optical member is aligned with the optical axes of optical members respectively rotated around the <110> axis by 45°, 90°, and 135° (FIGS. 4B, 4C, and 4D), these four optical members are arranged so that both the <111> axes and the <100> axes may not overlap each other. Accordingly, also in this case, the influence of intrinsic birefringence of a fluoride crystal can be sufficiently reduced.

Moreover, by controlling crystal plane orientations for each optical member in this way, optical members having various plane orientations can be combined to assemble an optical system, thus making it possible to improve the degree of freedom in design.

In the present invention, crystal plane orientations are preferably two or more selected from the group consisting of {111}, {100}, and {110} planes.

Moreover, in the present invention, it is preferable to provide a reference line for the crystal plane orientations on the ingot in the plane orientation measurement step, and to cut out the optical material from the ingot based on the reference line in the cutout step.

Also, in the present invention, the plane orientation measurement step preferably includes: measuring two or more crystal plane orientations of a test piece portion which is obtained by cutting off any one of top and cone portions of the ingot; and determining the crystal plane orientations of the ingot from the measured crystal plane orientations of the test piece. Note that, in this case, the cone portion means the circular cone portion at the tip portion of the ingot and the top portion means the opposite end of the ingot to the cone portion.

Furthermore, in the present invention, the plane orientation measurement step preferably utilizes a Laue method in which X-rays are applied to a subject to measure crystal plane orientations, and the Laue method preferably uses a side reflection method.

In addition, in the present invention, a deviation angle of the optical member from a crystal plane orientation in the cutout step is preferably 3° or less.

BRIEF DESCRIPTION OF THE DRAWINGS

FIGS. 10A to 10C, FIGS. 12A to 12C, FIGS. 14A and 14B, FIGS. 16A to 16C, FIGS. 18A to 18C, and FIGS. 20A to 20C are top views, each of which shows an ingot or an optical material cut out from the ingot in a predetermined step.

FIGS. 11A to 11C, FIGS. 13A to 13C, FIGS. 15A and 15B, FIGS. 17A to 17C, FIGS. 19A to 19C, and FIGS. 21A to 21C are side views, each of which shows an ingot or an optical material cut out from the ingot in a predetermined step.

BEST MODES FOR CARRYING OUT THE INVENTION

An optical member manufacturing method of the present invention has a growth process for growing a fluoride crystal ingot, a plane orientation measurement process for measuring two or more crystal plane orientations of the ingot, a cutout process for cutting out an optical material from the ingot along any one of the crystal plane orientations obtained in the plane orientation measurement process, and a machining process for performing predetermined machining processing on the optical material to obtain an optical member.

Figure 5:
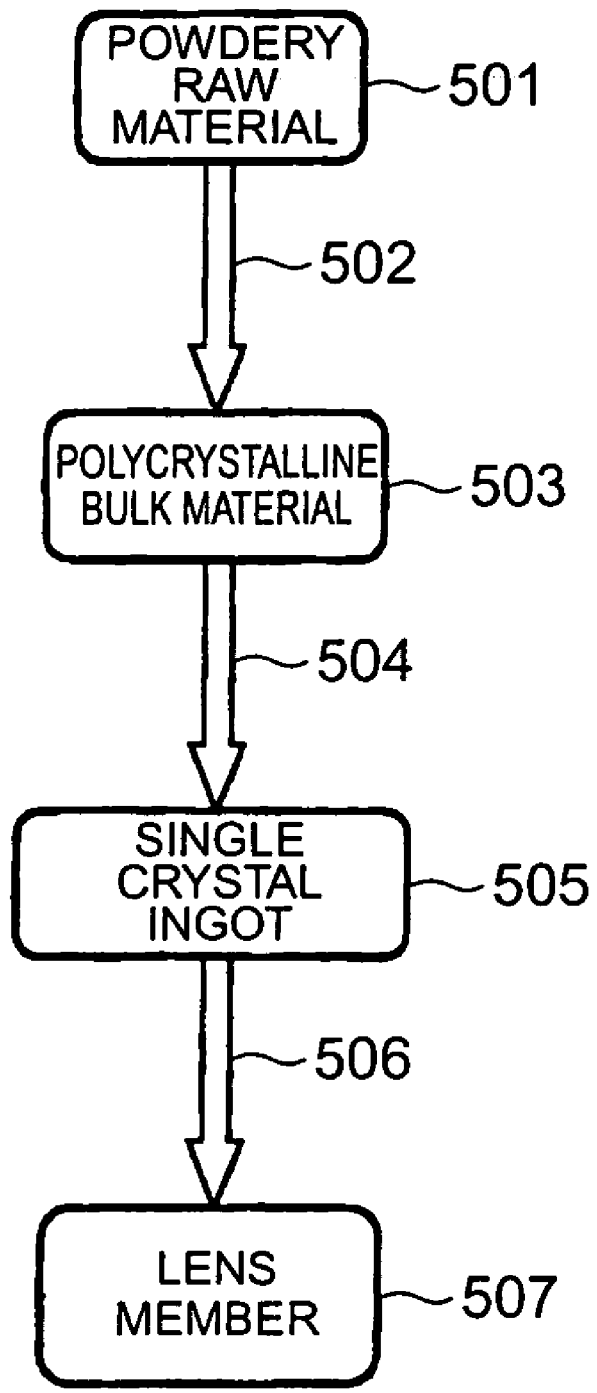
FIG. 5 is a flowchart showing the states of fluoride in each process according to the present invention.

FIG. 5 is a flowchart showing the states of fluoride in the respective processes. In FIG. 5, powder raw material 501 of fluoride undergoes preprocessing such as melting in the step 502 to become a polycrystalline bulk material 503, and further undergoes crystalline growth in the step 504 to become a single crystal ingot 505. Subsequently, in the step 506, two or more crystal plane orientations are measured for the ingot 505, and then an optical material is cut out along any one of the obtained crystal plane orientations. Predetermined machining processing (rolling, grinding, and the like) and, in some cases, also heat treatment (annealing) are performed on the optical material, thus obtaining a desired optical member 507.

Figure 6:
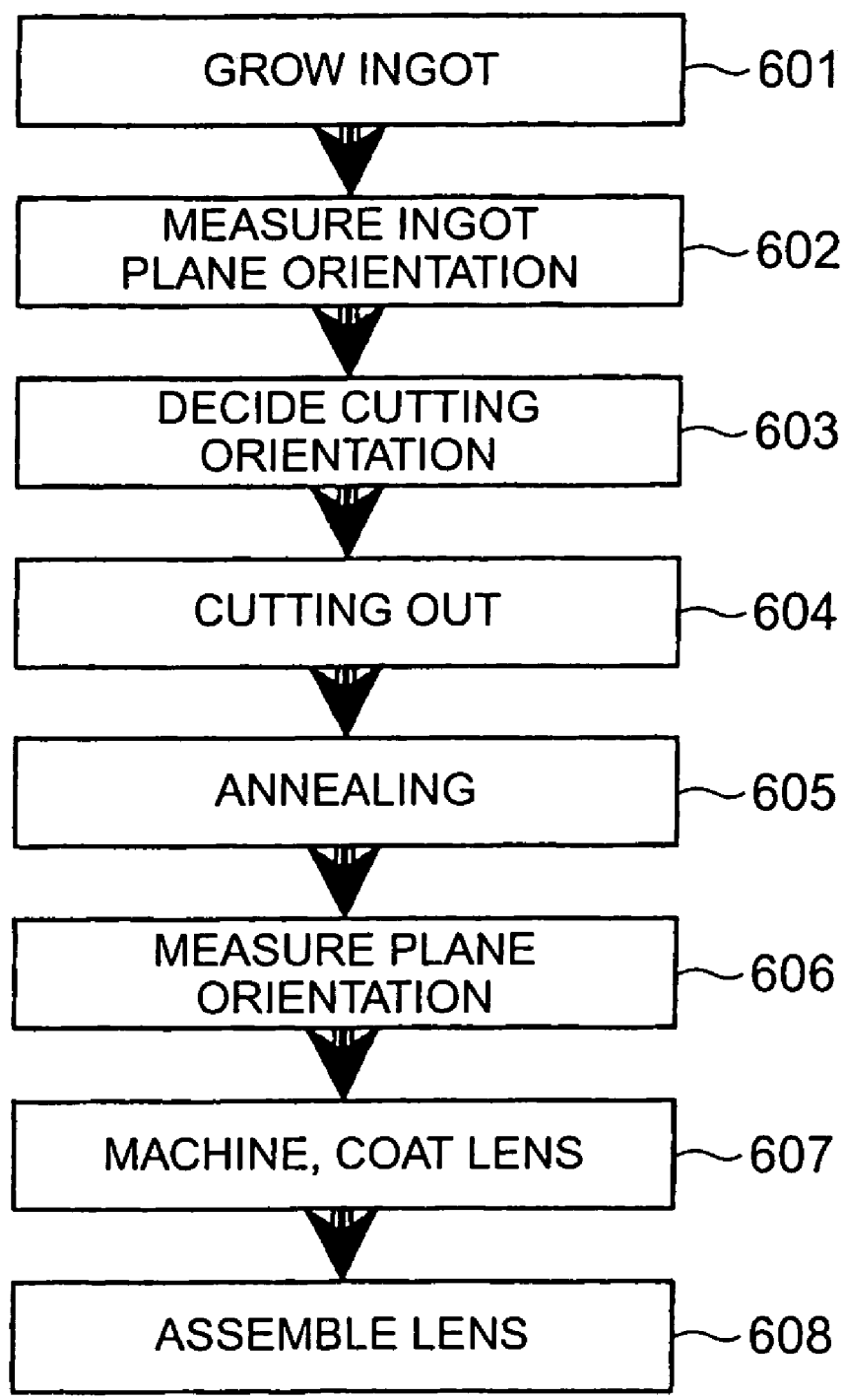
FIG. 6 is a flowchart showing an example of a manufacturing method of the present invention.

The manufacturing method of the present invention can be conducted, in accordance with, for example, the flowchart shown in FIG. 6. The manufacturing method shown in FIG. 6 includes the step 601 of growing an ingot of a fluoride single crystal, the step 602 of measuring crystal plane orientations of the ingot, the step 603 of deciding a cutting direction, the step 604 of cutting out an optical material, the step 605 of annealing, the step 606 of measuring plane orientations of the optical material, and the step 607 of performing lens machining and coating to obtain an optical member. The flowchart shown in FIG. 6 further includes the step 608 of assembling the obtained optical members (lenses or the like) to fabricate an optical system.

Hereinafter, the manufacturing method of the present invention will be described in accordance with the flowchart shown in FIG. 6.

The step 601 is a growth process for an ingot of a fluoride single crystal. As a growth method for the fluoride single crystal ingot, the Bridgeman method (the Stockbarger method, or the pulling down method), the Tammann method, and the like, which are melt methods, can be adopted. As a preferable example of the growth process, a growth process by the Bridgeman method (the Stockbarger method, or the pulling down method) will be described in detail below.

Figure 7C:
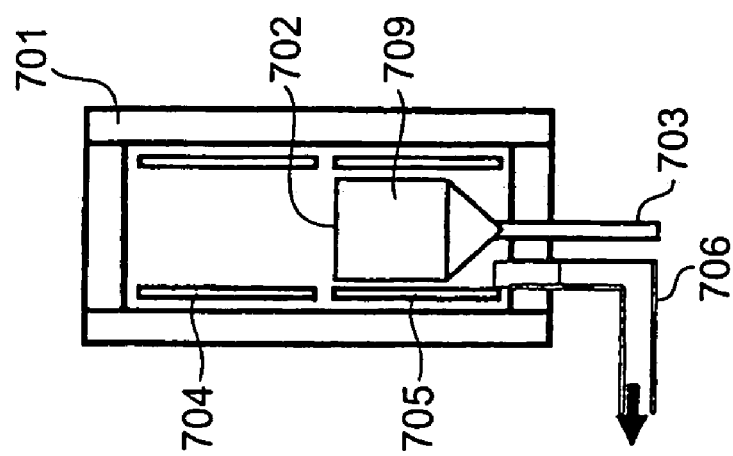
FIGS. 7A to 7C are cross-sectional views showing an example of a crystal growth apparatus according to the present invention, respectively.
Figure 7B:
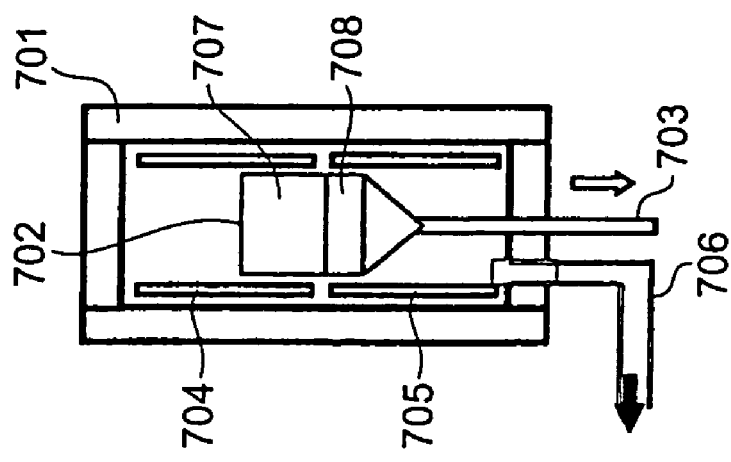
Figure 7A:
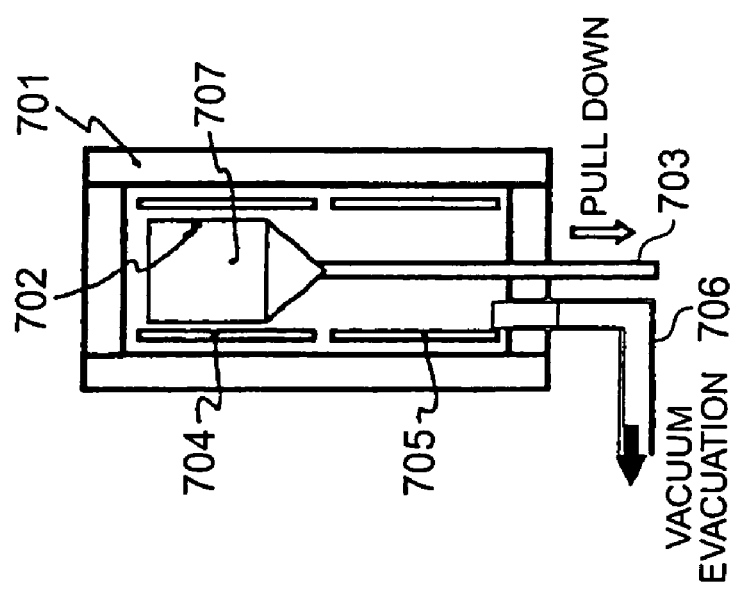

FIGS. 7A to 7C are respectively cross-sectional views showing an example of a growth apparatus for use in a growth process by the Bridgeman method. In FIGS. 7A to 7C, a carbon crucible 702 having the shape of a pencil (that is, having the shape of a column at the upper portion and the shape of a circular cone at the lower portion) is disposed inside an adiabatic and airtight growth furnace 701. A supporting member 703 is coupled to the lower tip of the crucible 702, and the crucible 702 can be moved vertically by use of the supporting member 703. Moreover, inside the growth furnace 701, a higher temperature heater 704 and a lower temperature heater 705 are respectively disposed at the upper and lower portions along the inner surface of the furnace 701, thus making it possible to perform heating so that the temperature in the furnace 701 may be lower at the lower portion than the upper portion. Furthermore, an exhaust line 706 for reducing pressure in the furnace is provided at the lower portion of the growth furnace 701.

In the growth process, first, as shown in FIG. 7A, the crucible 702 filled with raw material of a fluoride single crystal is placed at the upper portion inside the growth furnace 701. Then, the growth furnace 701 is exhausted through the exhaust line, and the inside of the growth furnace 701 is maintained in a vacuum atmosphere from $10^{-3}$ to $10^{-4}$ Pa. Subsequently, the temperature in the growth furnace 701 is raised above the melting point of the fluoride (1370 to 1450° C. in the case of calcium fluoride) by the heaters 704 and 705, whereby the raw material is melted to obtain melt 707. At this time, the temporal variation of the temperature in the growth furnace 701 can be suppressed by controlling the heaters 704 and 705 using either control by constant electric power output or PID control with high accuracy.

Here, in the case of a fluoride single crystal for use in the ultraviolet and vacuum ultraviolet regions, using high purity raw material, obtained by chemical synthesis, as raw material is preferable to using natural material (such as natural fluorite). Although raw material can be used as powder, volume decrease when melting is extremely in the case of powder raw material. Therefore, using a semi-melting product or a smashed product thereof is preferable.

Incidentally, if a seed crystal is put into the tip portion of the crucible 702, the crystal plane orientations of an obtained ingot is tend to be controlled relatively well. However, in actuality, the horizontal plane of the obtained ingot exhibits a random crystal plane orientation every time a crystal grows.

Next, as shown in FIG. 7B, the crucible 702 is pulled down by use of the supporting member 703 at a predetermined speed (preferably, 0.1 to 5 mm/h). Thus, the melt 707 is gradually crystallized from the lower portion of the crucible 702 to grow a fluoride single crystal 708 (crystal growth).

Then, as shown in FIG. 7C, the crucible 702 is pulled down to the lower portion inside the growth furnace 701. When the melt 707 is crystallized to the uppermost portion of the crucible 702, the crystal growth is stopped. Rapid cooling is avoided so that the grown crystal 709 (ingot) may not crack, and gradual cooling is performed until the temperature in the growth furnace 701 becomes approximately the room temperature. Thereafter, the growth furnace 701 is opened to the atmosphere, and the ingot 709 is taken out. Note that, since residual stresses in the ingot are generally very large, it is preferable that the ingot is slowly cooled down inside the furnace 701 to the room temperature.

The step 602 is a process for measuring crystal plane orientations of the calcium fluoride single crystal ingot obtained in the step 601. The step 603 is a process for deciding a cutout position of the optical material based on the crystal plane orientations obtained in the step 602.

In the present invention, crystal plane orientations can be measured by utilizing an X-ray based method, a mechanical method, an optical method, or the like.

An X-ray based method includes the Laue method in which X-rays are applied while a crystal is remaining stationary, the rotation method in which X-rays are applied while a crystal is being rotated, the oscillation method in which X-rays are applied while a crystal is being oscillated, the Weissenberg method improving on these methods, the precession method, and the like.

Next, a mechanical method will be described. In general, when plastic deformation is given to a crystal with appropriate means, various surface patterns characterized by a crystal plane orientation appear on the surface thereof. Such a surface pattern includes a pressure figure (or a percussion figure) having a shape specific to a crystal surface, a slip band along a specific crystal surface, a twin crystal, a cleavage, and the like. Incidentally, a twin crystal includes, in addition to twin deformation caused by plastic deformation, an annealing twin and a growth twin. These also form surface patterns. A twin crystal is a crystal having two crystal plane orientations which have a symmetric relationship, and has different crystal plane orientations in which, for example, the <111> axis is the same and the {100} plane is rotated around the <111> axis by 180°.

Specifically, a mechanical method includes a method utilizing a pressure figure, a method using a slip oval, a method utilizing a crossing angle among a slip line, a twin crystal, and other surface patterns, a method utilizing a cleavage plane, a method analyzing a slippage, a twin crystal, and a cleavage, and the like.

An optical method includes a lateral horn method, an etched figure method, a light figure method, a polarization method, and the like.

Among these measurement methods, an x-ray based method has high measurement accuracy and high speed, and therefore is preferably adopted in the present invention. Hereinafter, an X-ray based method will be described in detail.

When X-rays are used, a back reflection Laue camera is attached between an X-ray tube and a sample. The distance between the surface of the sample and a film is set to several tens mm. The X-ray tube uses a Mo target, and photography is performed under the conditions that a tube voltage is 40 kV, a tube current is 50 mA, and exposure time is 60 sec. Orientation analysis is conducted by manual calculation based on an obtained Polaroid photograph of a Laue pattern or by scanning the photograph into a computer using a scanner to calculate.

The Laue method is one of X-ray diffraction methods, in which white X-rays are applied to a fixed single crystal. Since a Bragg angle $\theta$ is fixed for any planes of the crystal, each plane selectively diffracts X-rays having a wavelength $\lambda$ which satisfies the Bragg condition $\lambda = 2d \cdot \sin \theta$ for the respective plane distance d and the respective Bragg angle $\theta$.

The Laue method is classified into three methods, which are the transmission method, the back reflection method, and the side reflection method, depending on the difference in relative positions of an X-ray source, a crystal, and a film or a CCD camera. In the transmission method, a film or a CCD camera is placed behind a crystal in order to record diffraction beams toward the front of the crystal. In the back reflection method, a film is placed between a crystal and an X-ray source, an incident beam passes through a hole opened in the film, and diffraction beams toward the back of the crystal are recorded. In the side reflection method, an X-ray source is placed so that X-rays may enter a crystal at a predetermined incident angle $\omega$, and a film or a CCD camera is placed at a position rotated by an angle $\phi$ with respect to the incident beam in order to record diffraction beams toward the direction of an arbitrary side surface of the crystal. In any method, diffraction beams form Laue spots on a film or a fluorescent screen. Since the positions of Laue spots are determined by the relative relationship of a crystal orientation to an incident beam, the crystal orientation is determined by applying this.

Figure 8:
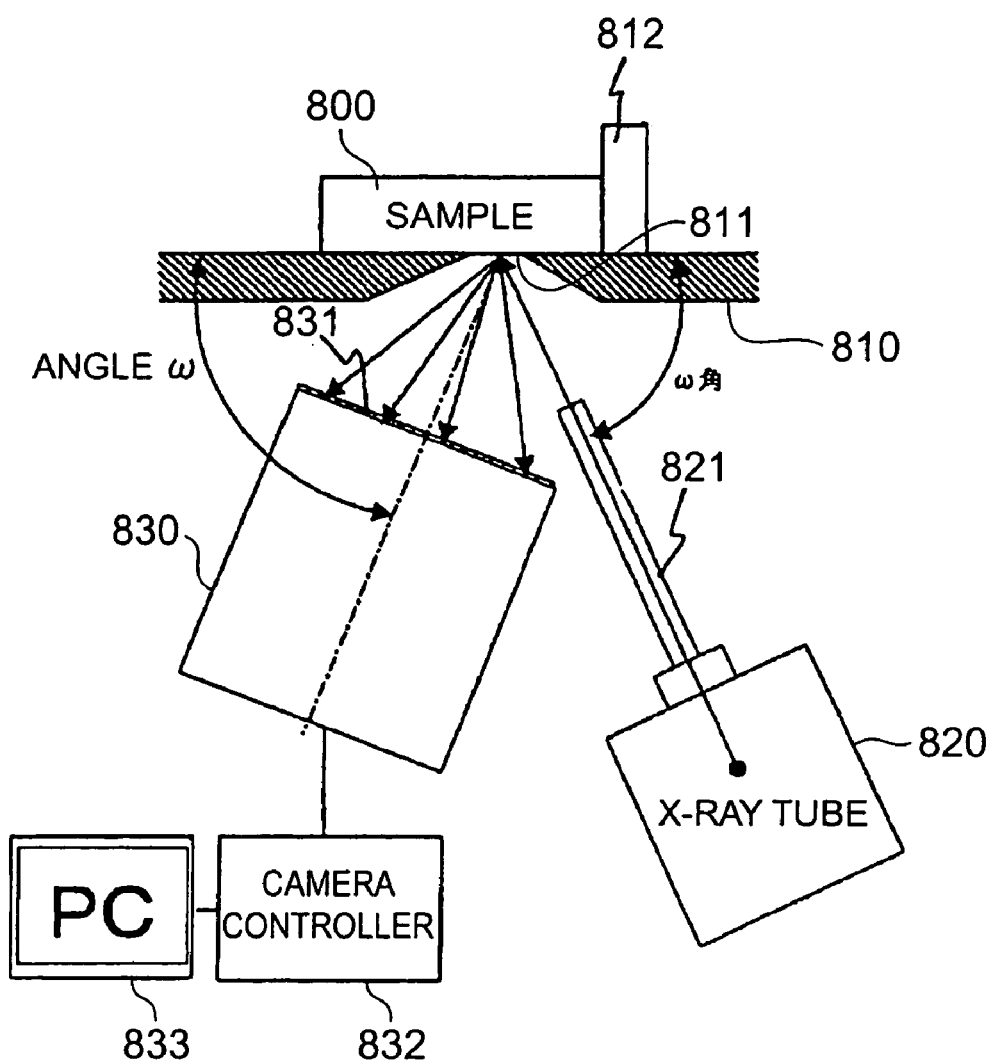
FIG. 8 is a schematic block diagram showing an example of a plane orientation measurement apparatus according to the present invention.

FIG. 8 is a schematic block diagram showing an example of a measurement apparatus (automatic measurement apparatus) for a crystal plane orientation which utilizes the Laue method. The apparatus shown in FIG. 8 is provided with a sample stage 810, an X-ray tube 820, and a CCD camera 830.

At a predetermined position of the sample stage 810, an X-ray irradiation portion 811 which connects the upper and lower surfaces thereof is formed. On the upper surface of the sample stage, a guide bar 812 for fixing a sample 800 is provided.

The X-ray tube 820 is provided with a collimator 821, and these are disposed so that the angle between an X-ray applied to the X-ray irradiation portion 811 and an X-ray irradiation surface of the sample 800 may be ω. As the X-ray tube 820, one which uses a tungsten target and has the maximum output of 2 kW, a tube voltage of 50 kV, and a tube current of 40 mA, is preferably used. As the collimator 421, a double pinhole collimator with a diameter of approximately 1 mm φ is preferably used.

The CCD camera 830 has a fluorescent screen 831 on a surface thereof facing the X-ray irradiation portion 811. The CCD camera 830 is disposed so that the angle between a line perpendicular to the fluorescent screen 831 and the X-ray irradiation surface of the sample 800 may be ω. Moreover, to the CCD camera 830, a computer 833 is electrically connected through a camera controller 832, and diffraction beams obtained by x-ray irradiation to the sample 800 are analyzed as a Laue pattern by the computer 833. The CCD camera 830 is cooled down to a predetermined temperature (for example, −50° C.) by a Peltier element, thus improving an SN ratio.

In the present invention, when crystal plane orientations of a large sample, such as a φ300 mm×t60 mm block, are measured, it is preferable to use the method described below.

First, the sample 800 is flatly placed on the stage 810, and, thereunder, an optical system including the X-ray source (the X-ray tube 820 and the collimator 821) and the CCD camera 830 is disposed as described above. Flatly placing the sample 800 on the stage 810 makes it is possible to deal with a large sample. Furthermore, by the side reflection method, damage to the sample due to X-ray irradiation can be sufficiently reduced.

In the present invention, it is preferable to provide test pieces obtained by cutting out the top and cone portions of an ingot for the plane orientation measurement process. Note that the direction of a test piece is not particularly limited, but that a test piece is disposed so that, for example, a position reference line, described later, may be located at the front. Incidentally, since a test piece of a cone portion has the shape of a circular cone, it is disposed so that the bottom surface of the circular cone may face downward (the stage side), and measured values of plane orientations are checked against the other portion by turning the test piece over.

Next, X-rays which are generated in the X-ray tube 820 and which are made approximately parallel by the collimator 821 and collimated to a beam diameter of approximately 2 mm, are applied to the sample 800. Approximately 10 seconds is sufficient for X-ray irradiation time.

Then, diffraction beams due to X-ray irradiation of the sample 800 are projected on the fluorescent screen 831 to be imaged by the CCD camera 830, and a Laue pattern is scanned into the computer 832. The scanned Laue pattern is analyzed on an orientation analysis screen. The Laue pattern comprises a plurality of point sequences, and one point sequence represents diffraction spots from the same zone axis. If four spots (intersection points between point sequences), each of which belongs to a plurality of zone axes, are designated out of such diffraction spots by a mouse pointer, indices are automatically determined. When a simulated patten matches the Laue pattern, both the patterns are displayed in an overlapping manner. The degree of coincidence between both the patterns are judged by a measurer. When indices are determined, a stereo projection drawing, a stereo triangle, and a plane orientation angle for each plane are outputted as analysis results of crystal plane orientations.

Figure 9:
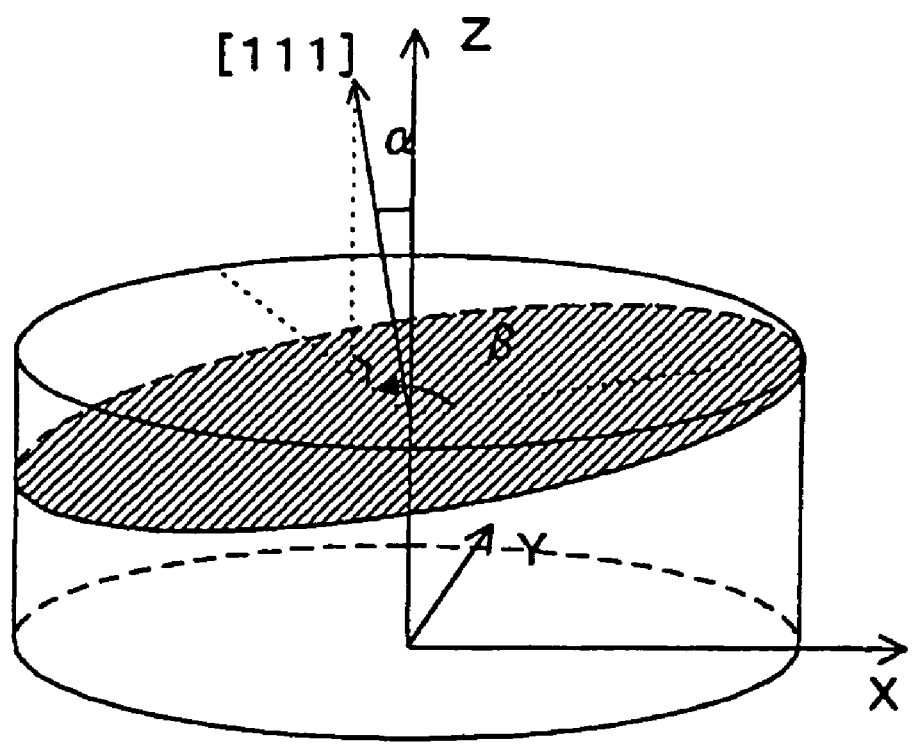
FIG. 9 is an explanatory view showing the concept of plane orientation angles α and β.

FIG. 9 is an explanatory view showing a concept of a plane orientation angle in a cylindrical member. An explanation will be made taking the plane orientation angles for a (111) plane as an example. In the coordinate system in which the innermost side of the sample stage 810 is set as the positive direction of the x axis and the vertical downward direction of the sample stage 810 is set as the positive direction of the z axis, the plane orientation angles are represented by α set as the angle between the z axis and the [111] axis and by β set as the angle of a line, which is the projection of the [111] axis on the measured surface, counterclockwise from the positive direction of the x axis.

The Laue method enables easy and convenient measurement of various crystal plane orientations, has high measurement accuracy, requires short time for measurement, and therefore is preferred. Moreover, it is preferred to measure the angle deviation between a sample surface and a crystal plane based on Laue spots which are obtained by the side reflection Laue method. In the Laue method, the back reflection method or the transmission method is generally used, but these methods have a significant damage on a sample. On the other hand, in the side reflection method, since X-rays are made incident on a sample surface at a predetermined incident angle (for example, 60°), the depth of penetration of X-rays becomes shallow, thus making it possible to sufficiently reduce the damage on the sample.

Next, in the step 604, an optical material is cut out from the ingot based on the measured crystal plane orientations. In the step 605, the cut out optical material is annealed. In the step 606, for the optical material after annealing, plane orientations are measured for quality control. The optical material thus obtained undergoes a predetermined machining processing and coating processing in the step 607 to become an optical member, and then is provided for in the step 608 for assembling lenses. Note that details of the steps 604 to 608 will be described later.

Next, the states of the ingot, the optical material, and the optical member in the respective above-described processes will be more precisely described. FIGS. 10A to 10C, FIGS. 12A to 12C, FIGS. 14A to 14B, FIGS. 16A to 16C, FIGS. 18A to 18C, and FIGS. 20A to 20C are top views, each of which shows an ingot or an optical material cut out from the ingot in a predetermined step. On the other hand, FIGS. 11A to 11C, FIGS. 13A to 13C, FIGS. 15A to 15B, FIGS. 17A to 17C, FIGS. 19A to 19C, and FIGS. 21A to 21C are side views, each of which shows an ingot or an optical material cut out from the ingot in a predetermined step.

FIGS. 10A and 11A show an ingot of a fluoride single crystal obtained in the growth process. A predetermined position (for example, a portion having faced the front within the furnace) on the side surface of this ingot is ground and smoothed with a wire brush. Further, a straight line is drawn with a special pencil for drawing on the glass, thus providing a position reference line (FIGS. 10B and 11B).

Subsequently, the circular cone-shaped portion (cone portion) at the tip of the ingot and the end portion (top portion) opposite with the cone portion are cut off so as to each have a predetermined thickness (for example, 30 mm), thus obtaining test pieces for crystal plane orientation measurement (FIGS. 10C and 11C). Crystal plane orientations of these two test pieces are measured by the Laue method, and plane orientations of the ingot main body are estimated based on the measurement result. In this case, the positional relationship among the ingot main body and the two test pieces is confirmed using the above-described position reference line as a reference mark.

Incidentally, it is possible to provide the whole ingot as it is for the plane orientation measurement process without cutting off the cone and top portions. However, handling is difficult due to the ingot weight of several tens kg. Moreover, in the case of calcium fluoride, since an expansion coefficient is large and a mechanical strength is not large, there is a risk of ingot breakage. Due to the above-described reasons, using test pieces obtained from the top and cone portions as described above is preferable. Furthermore, since the above-described test pieces can be used for evaluation of excimer laser tolerance after plane orientation measurement, there is also a merit of eliminating the necessity of repeating the cutout process for fabricating test pieces.

Incidentally, a single crystal of calcium fluoride, barium fluoride, or the like has cleavage planes on {111} planes. Therefore, when an ingot cracks due to thermal stresses or the like, the ingot generally cracks along a {111} plane. Even in the case of a uncleaved ingot, when an end portion of the ingot is slightly hit with a chisel or the like, the ingot cleaves. It is general to obtain a material for fabricating an optical element by cutting an ingot parallel to the cleavage plane using the cleavage plane as a reference. Thus, a material in which two opposing planes are {111} planes can be obtained. In this way, there is a method using a cleavage plane as a reference. However, according to the Laue method or the like, it is possible to immediately measure crystal plane orientations for not only a {111} plane but also {110} and {100} planes and the like in a nondestructive manner.

Meanwhile, the ingot main body from which the cone and top portions have been cut off undergoes rounding machining, and a cylindrical surface portion is made a surface equivalent to one finished with smoothing (FIGS. 12A and 13A). Moreover, it is also possible to perform flat grinding with a width of several cm on the side surface of the ingot main body from which the cone and top portions have been cut off, thus observing the inside of the ingot main body (FIGS. 14A and 15A). In addition to the observation from the surface of smoothed surface, an internal observation with refractive index matching oil applied in a darkroom, an observation of stress concentration or the like on an interface with a cross nicol optical system are performed, thus confirming the states of a sub-grain boundary and a polycrystal, the positions of the interfaces thereof, the bubbles and inclusions, and the like. In the case where the whole ingot is a single crystal, if the plane orientation of one position for any one of the cone and top portions is measured, plane orientations of the whole ingot can be estimated. However, it is preferable to measure plane orientations for each of the cone and top portions by way of precaution to confirm that there is no inconsistency between these plane orientations. Furthermore, there are also many cases where the ingot is a polycrystal or where a sub-grain boundary exist. In such a case, it is necessary to measure a crystal orientation for each single crystal portion in the ingot.

Based on the plane orientation angles ($\alpha$ and $\beta$ in FIG. 9) which have been obtained using the above-described test pieces, a cutting direction of the ingot is decided (FIGS. 12C and 13C, or FIGS. 14B and 15B). In the case where the plane orientation angles of the test piece fabricated from the top portion are used, a bearing surface (machining reference surface) is the side surface in the direction ($90°-\beta$) where the plane normal of the cutting plane of the top portion is set as the center and the counterclockwise direction from the reference line direction is set as positive when the ingot is viewed from the top portion side, and a cutting direction is the direction of $\alpha$ when the cutting plane of the top portion is set as a reference surface and the clockwise direction is set as positive. On the other hand, in the case where the plane orientation angles of the test piece fabricated from the cone portion are used, a machining reference surface is the side surface in the direction ($90°-\beta$) where the plane normal of the cutting plane of the cone portion is set as the center and the counterclockwise direction from the reference line direction is set as positive when the ingot is viewed from the cone portion side, and a cutting direction is the direction of $\alpha$ when the cutting plane of the top portion is set as a reference surface and the clockwise direction is set as positive. At this time, it is preferable to decide the cutting position so that the thickness and the diameter may be larger than the dimensions of a desired part by 5 to 10 mm in consideration of machining allowances (margins) in the subsequent processes, such as the annealing process and the like, while avoiding foams and foreign substances inside the ingot.

When the ingot is cut, first, a ground surface (bearing surface) which is parallel to the axis of the ingot is made on the side surface of the ingot along the bearing surface direction decided based on the plane orientation angles. Next, the ingot is placed on a stage of a cutting machine so that the bearing surface may face downward, and the ingot is rotated by the angle a and cut using the cutting plane of the top portion as a reference surface. FIGS. 16A and 17A are respectively a top view and a side view which show an oval disk obtained by cutting. For this disk, an internal observation in a darkroom with a refractive index matching oil applied and observations regarding stress concentration and the like on an interface using a cross nicol optical system are performed, thus confirming the states of a sub-grain boundary and a polycrystal and the positions of the interfaces thereof. Then, the cutting position is decided so that the thickness and the diameter may be larger than the dimensions of a desired part by 5 to 10 mm in consideration of machining allowances (margins) in the subsequent processes, such as the annealing process and the like. Thereafter, cutting (rough cutting) (FIGS. 16B and 17B) and rounding (FIGS. 16C and 17C) are performed.

Next, for a material after the rounding process, rough grinding and beveling for inspecting crystal plane orientations are performed, thus obtaining a cylindrical material ($\phi$260 mm×t50 mm, $\phi$200 mm×t60 mm, or the like) (FIGS. 18A and 19A). At this time, marking is performed on the material again, and the marking is maintained in the subsequent processes, thus making clear the relationship between the plane orientations and the reference line added before cutting off the top and cone portions from the ingot. Accordingly, it is possible to control the plane orientations of an optical member which is finally to be obtained. Moreover, by performing heat treatment (annealing) on the obtained member, it is possible to reduce the value of birefringence to further improve the quality. In the case where marking for maintaining a crystal orientation is added to the material to be provided for annealing, it is preferable to use a soft pencil or red oil-based ink, which does not make a scratch on the surface of calcium fluoride and does not cause impurity contamination. Red oil-based ink changes into black after annealing, thus enabling discrimination between before and after annealing.

Furthermore, it is preferable to perform mapping of plane orientations of the cylindrical material before heat treatment. The material at this stage has the final shape of a lens with an excess of 2.5 to 5 mm, and is therefore suitable for mapping. Note that, in the case of plane orientation measurement with X-ray irradiation such as the Laue method, when the material having a shape close to that of a lens is used for mapping, it is damaged by X-ray irradiation and tends to cause a phenomenon in which color centers are formed. Thus, measurement is performed only outside an optical design effective diameter, that is, only the surrounding region in a range of several mm.

In the case where annealing is performed on the cylindrical material, the material is placed in side a furnace of a heat treatment apparatus so that both flat surfaces thereof may face upward and downward, and is heated to a predetermined temperature (for example, 1080° C.) by a heater. At this time, if the furnace of the heat treatment apparatus has a vacuum structure, it is possible to prevent mixture of oxygen, which causes haze of calcium fluoride. As such a furnace, one which has a stainless steel external structure (furnace main body) and in which a carbon heater and carbon container are disposed, can be cited.

When annealing, it is preferable to seal a predetermined amount (in general, approximately 100 g) of ammonium hydrogen fluoride together with the optical material. Thus, oxygen inside the furnace can be completely removed to coat metal exposed on an inner surface of the furnace with fluoride. In this state, the furnace is evacuated by a vacuum pump, and then warm-up is started. When the temperature in the furnace reaches around 500° C., the vaporization of ammonium hydrogen fluoride begins, and the pressure inside the furnace becomes a very low positive pressure (2 to 8 kPa). While the pressure is being controlled so as to keep this pressure, warm-up, keeping at a predetermined temperature (for example, 1080° C.), and gradual cooling down are performed.

Note that, before the above-described annealing is performed, it is preferable to seal only ammonium hydrogen fluoride into the furnace and conduct a preliminary experiment for confirming whether abnormalities exist in the state inside the furnace and the change in the pressure. Furthermore, it is preferable to seal a test piece for transmittance measurement and ammonium hydrogen fluoride into the furnace to perform heat treatment, and conduct a transmittance experiment for confirming that the transmittance of the test piece is not reduced by contamination or the like due to heat treatment.

The above-described annealing is performed, whereby it is possible to sufficiently reduce the amount of birefringence for all crystal plane orientations of a fluoride crystal due to thermal stresses. In the present invention, since two or more crystal plane orientations are controlled, it is preferable to reduce the absolute value of the amount of birefringence regardless of crystal plane orientation. To be more precise, the absolute value of birefringence for light having a wavelength of 633 nm is preferably 2.0 nm/cm or less, more preferably, 1.0 nm/cm or less. If the absolute value of birefringence exceeds 2.0 nm/cm, control of intrinsic birefringence depending on crystal plane orientations tends to become difficult. Birefringence for light having a wavelength of 633 nm is significantly influenced by intrinsic birefringence for a wavelength at which the fluoride crystal is actually used as an optical member (for example, 193 nm or the like). Accordingly, controlling also the amount of birefringence due to thermal stresses is very effective.

Next, window machining is performed on the side surface of the annealed cylindrical material, and each of the upper and lower surfaces is ground by a same predetermined amount (for example, a thickness of 2.5 to 5 mm) (FIGS. 18C and 19C). For the obtained optical material, homogeneity of the birefringence and refractive index of the side surface is confirmed (FIGS. 20A and 21A), then rounding is performed thereon (FIGS. 20B and 21B), and further, grinding (false polishing) and beveling are performed thereon, thus obtaining a desired optical member (FIGS. 20C and 21C). The optical member thus obtained undergoes a quality inspection by measurement of birefringence and then is shipped. The birefringence of the optical member can be obtained, for example, by automatically measuring approximately 200 points with a measurement wavelength of 633 nm using an automatic birefringence measurement system made by ORC manufacturing Co., Ltd. or Uniopt Co., Ltd.

Thus, according to the manufacturing method of the present invention, two or more crystal plane orientations of the obtained optical member can be easily and certainly controlled. As a result, when an optical system is fabricated using the optical member, the influence of intrinsic birefringence of a fluoride crystal can be sufficiently reduced to achieve high-level imaging performance.

Moreover, in the obtained optical member, the deviation angle between a predetermined crystal plane orientation and a cutting plane can be set within a predetermined range. This deviation angle can be used up to a maximum of approximately 6° in the state where they deviate most largely. However, 4° or less is preferable, 3° or less is more preferable, and 2° or less is particularly preferable.

The Laue method has an advantage that the presence or absence of a twin crystal can be confirmed additionally to crystal plane orientations. Specifically, a material is cut out so that the boundary of a twin crystal may be included in a plane perpendicular to an optical axis, whereby the influence on the optical performance of an optical system when a twin-crystal optical member is used can be reduced to the minimum.

Next, an example of a projection exposure system on which an optical member made of a fluoride crystal obtained by the present invention is mounted, will be described.

Figure 22:
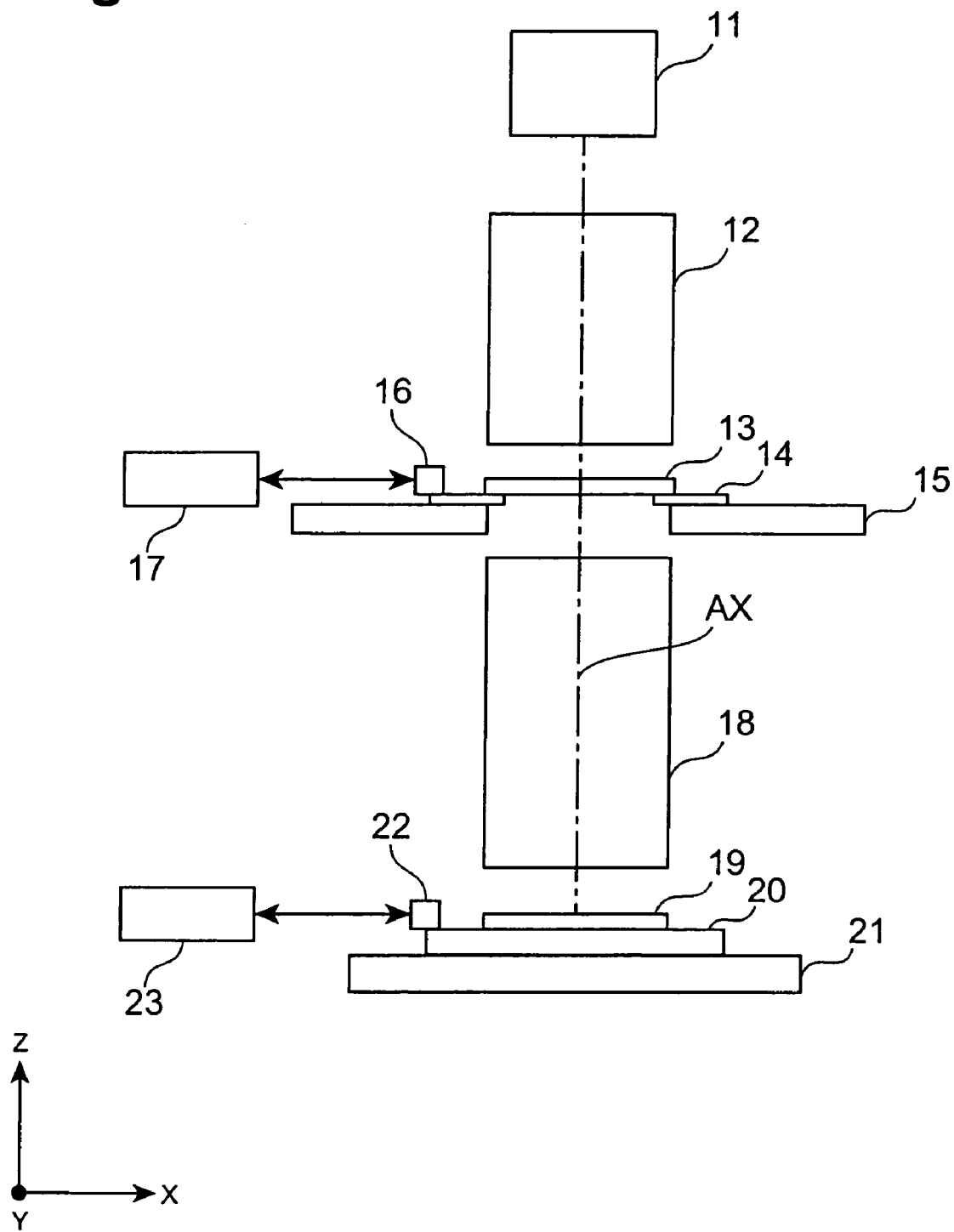
FIG. 22 is a schematic block diagram showing an example of a projection exposure system.

The projection exposure system shown in FIG. 22 is provided with a $F_2$ laser (wavelength: 157 nm) as a light source 11 for supplying illumination light in the ultraviolet region. Light emitted from the light source 11 uniformly illuminates through an illumination optical system 12 a mask 13 on which a predetermined pattern is formed.

Incidentally, in the optical path from the light source 11 to the illumination optical system 12, one or more bending mirrors for changing an optical path are disposed as needed. The illumination optical system 12 comprises, for example, a fly's eye lens, an internal reflection integrator, and the like. The illumination optical system 12 has, for example, a field stop for defining a surface light source having predetermined size and shape and an optical system such as a field stop imaging optical system for projecting an image of the field stop on the mask 13. Furthermore, the optical path between the light source 11 and the illumination optical system 12 is sealed in a casing (not shown), and a space from the light source 11 to an optical member disposed near the mask 13 in the illumination optical system 12 is displaced with inert gas (nitrogen, helium, or the like) which has a low absorptance for exposure light.

The mask 13 is held on a mask stage 15 with a mask holder 14 therebetween parallel to the XY plane. A pattern to be transferred is formed on the mask 13. Out of the whole pattern region, a slit-shaped pattern region having a long side along the Y axis direction and a short side along the X axis direction is illuminated.

The mask stage 15 is constituted so that it can two-dimensionally move along the mask plane (XY plane) and that the position coordinates thereof may be measured and controlled by an interferometer 17 using a mask movement mirror 16.

Thus, the mask 13, the mask holder 14, and the mask stage 15, which are disposed between the illumination optical system 12 and a projection optical system 18, are stored in a casing (not shown), and the inside of the casing is displaced with inert gas (nitrogen, helium, or the like).

Light from the pattern formed on the mask 13 forms a mask pattern image on a wafer 19, which is a photosensitive substrate, through the catadioptric projection optical system. The wafer 19 is held on a wafer stage 21 with a wafer holder 20 therebetween parallel to the XY plane. Optically corresponding to the slit-shaped illumination region on the mask 13, a pattern image is formed on the wafer 19 in a slit-shaped exposure region having a long side along the Y axis direction and a short side along the X axis direction.

The wafer stage 21 is constituted so that it can two-dimensionally move along the wafer plane (XY plane) and that the position coordinates thereof may be measured and controlled by an interferometer 23 using a wafer movement mirror 22.

The wafer 19, the wafer holder 20, and the wafer stage 21 are stored in a casing (not shown), and the inside of the casing is displaced with inert gas (nitrogen, helium, or the like).

Thus, in the projection exposure system shown in FIG. 22, an atmosphere in which absorption of exposure light is reduced is formed over the whole region of the optical path from the light source 11 to the wafer 19. Moreover, as described above, the shapes of the illumination region (field region) on the mask 13 and the projection region (exposure region) on the wafer 19, which are formed by the projection optical system 18, are the shape of a slit which has a short side along the X axis direction. Therefore, while the positions of the mask 13 and the wafer 19 are being controlled using a driving system, the interferometers 17 and 23, and the like, the mask stage 15 and the wafer stage 21 as well as the mask 13 and the wafer 19 are synchronously moved along the short side directions (X axis direction) of the slit-shaped illumination and exposure regions, thus scanning and exposing a region on the wafer 19 which has the same width as that of the long side of the exposure region and a length according to the scanning distance (moving distance) of the wafer 19.

In addition, for optical members (lens, prism, or the like) constituting the illumination optical system 12 and the projection optical system 18, using an optical member of the present invention in which two or more crystal plane orientations are controlled is effective.

Figure 23:
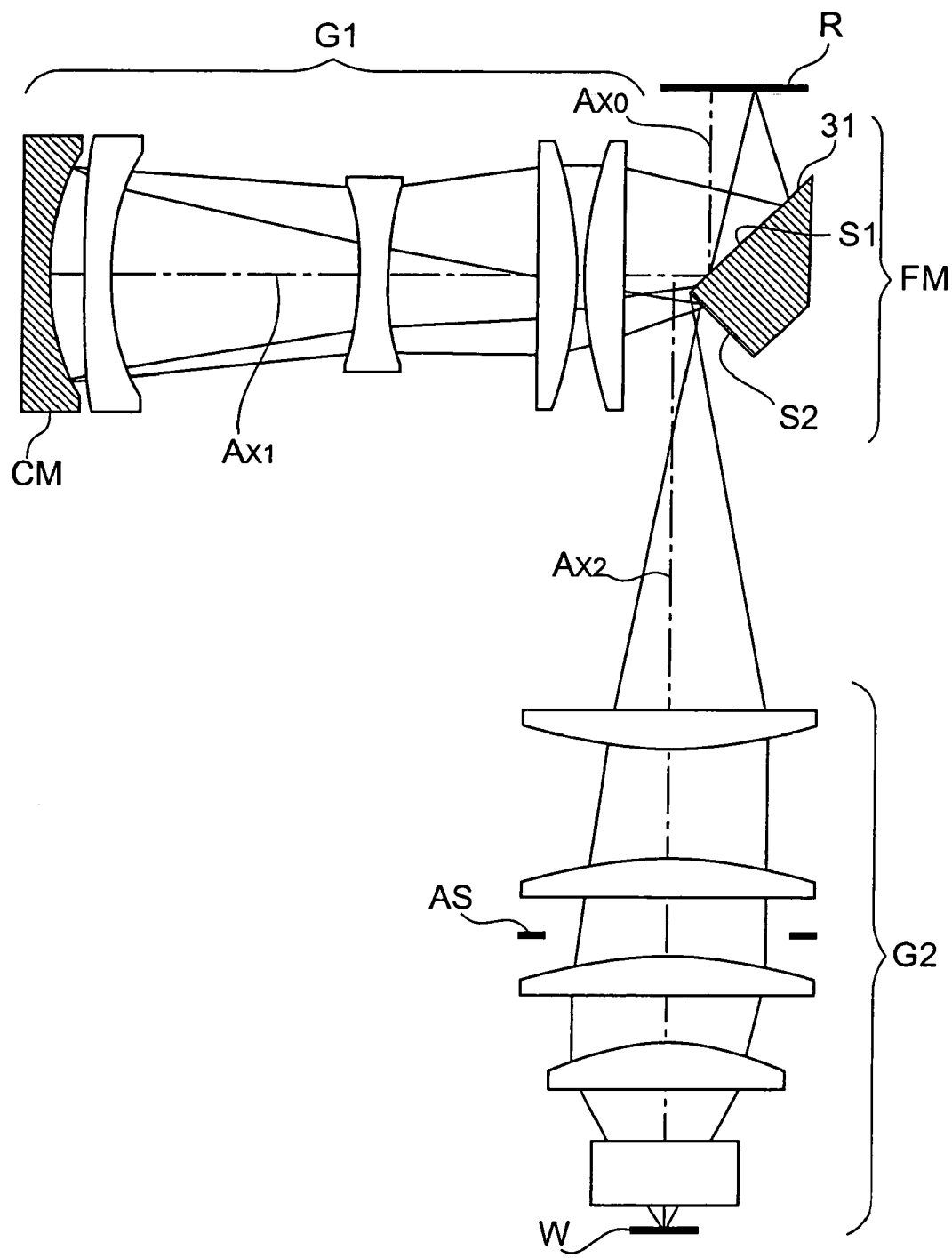
FIG. 23 is a schematic block diagram showing an example of a projection optical system.

FIG. 23 is a schematic block diagram showing an example of a projection optical system for use in the projection exposure system of the present invention.

In FIG. 23, the projection optical system has a first imaging optical system G1 of a catadioptric type which forms an intermediate image of a pattern on a reticle R as a projection master plate, and a second imaging optical system G2 of a refractive type which reimages the intermediate image by the first imaging optical system G1 on a wafer W as a workpiece. On the optical axis AX1, an optical path bending member is disposed, which is provided with a reflection plane S1 for deflecting the optical path from the reticle R toward the first imaging optical system G1 by 90° and with a reflection plane S2 for deflecting the optical path from the first imaging optical system G1 toward the second imaging optical system G2 by 90°.

The first imaging optical system G1 has a plurality of lens components and a concave reflective mirror along the optical path AX1, and forms an intermediate image at an approximately equal magnification or a slight demagnification.

The second imaging optical system G2 has a plurality of lens components, which are disposed along the optical axis AX2 perpendicular to the optical axis AX1, and a variable aperture stop AS for controlling a coherence factor. The second imaging optical system G2 forms a secondary image at a predetermined demagnification based on light from the intermediate image.

Here, the optical axis AX0 in FIG. 23 is the optical axis which is between the reticle R and the reflective mirror 31 and which is perpendicular to the optical axis AX1 of the first imaging optical system G1. The optical axes AX0 and AX2 may be on the same straight line.

Moreover, though a projection optical system comprising first and second imaging optical systems G1 and G2 each of which has a plurality of lens components is shown in FIG. 23, the number of lens components disposed along the optical axes AX1 and AX2 may be either one or more.

Furthermore, the angle between the optical axes AX0 and AX1 is not necessarily 90° and may be, for example, an angle obtained by counterclockwise rotating the concave reflective mirror CM. In this case, the bending angle of the optical axis at the reflection plane S2 is preferably set so that the reticle R and the wafer W may be parallel.

Figure 24:
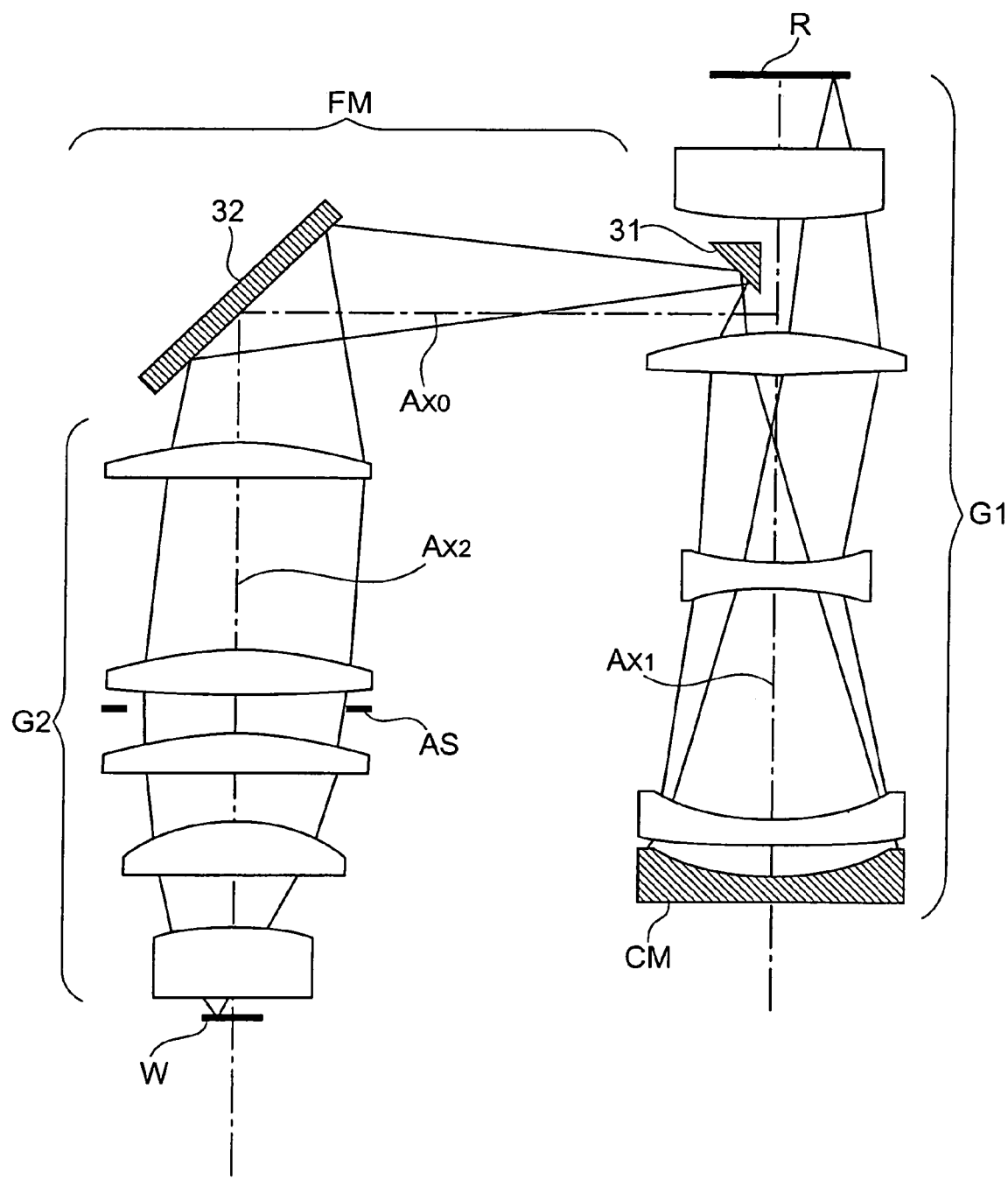
FIG. 24 is a schematic block diagram showing another example of a projection optical system.

Moreover, in the present invention, as shown in FIG. 24, a projection optical system provided with two reflective mirrors 31 and 32 can be also used.

Figure 25:
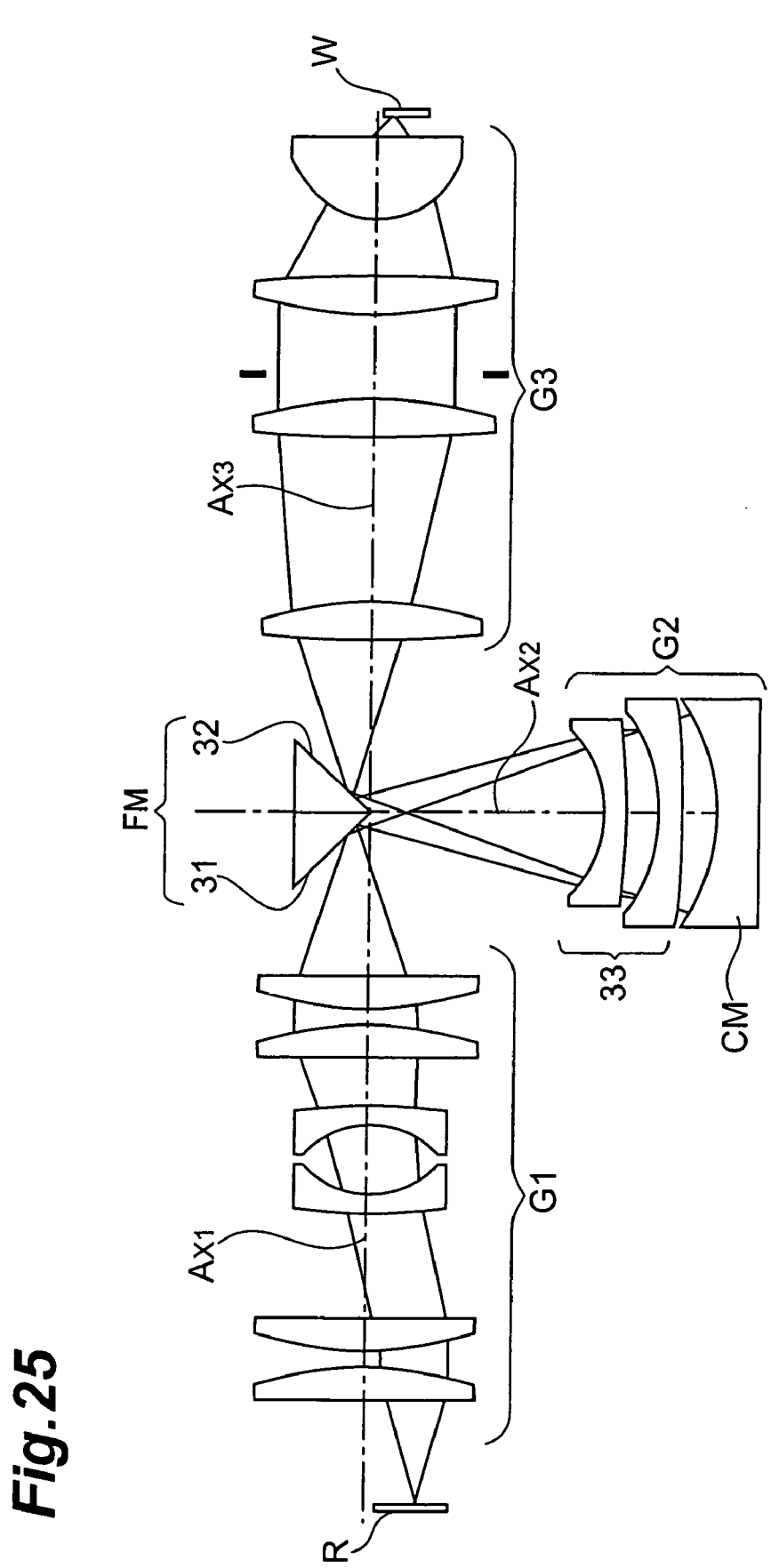
FIG. 25 is a schematic block diagram showing another example of a projection optical system.

Furthermore, in the present invention, a projection optical system having the structure shown in FIG. 25 can be also used. In FIG. 25, the projection optical system is provided with a first imaging optical system G1 of a catadioptric type, which forms an intermediate image of a pattern of a reticle R as a projection master plate. A first optical path bending reflective mirror 31 is disposed in the vicinity of the first intermediate image formed by the first imaging optical system G1. By the first optical path bending reflective mirror 31, a bundle of rays toward the first intermediate image or a bundle of rays from the first intermediate image is deflected toward a second imaging optical system. The second imaging optical system G2 has a concave reflective mirror CM and at least one negative lens 33. Based on the bundle of rays from the first intermediate image, the second imaging optical system G2 forms a second intermediate image (which is an image of the first intermediate image and which is also a secondary image of the pattern) which is at approximately the same magnification as that of the first intermediate image, in the vicinity of the first intermediate image.

In the vicinity of the formation position of the second intermediate image formed by the second imaging optical system G2, a second optical path bending reflective mirror 32 is disposed. By the second optical path bending reflective mirror 32, a bundle of rays toward the second intermediate image or a bundle of rays from the second intermediate image is deflected toward a third imaging optical system G3. Note that the reflection planes of the first and second optical path bending reflective mirrors 31 and 32 are disposed so as not to spatially overlap each other.

Based on the bundle of rays from the second imaging optical system, the third imaging optical system G3 forms a demagnified image of the pattern of the reticle R (which is an image of the second intermediate image and which is also a final image of the catadioptric optical system) on a wafer W as a workpiece (photosensitive substrate) placed on a second surface.

The projection optical systems shown in FIGS. 23 to 25 are suitably used in the case where the exposure light source is, for example, a $F_2$ laser.

Figure 26:
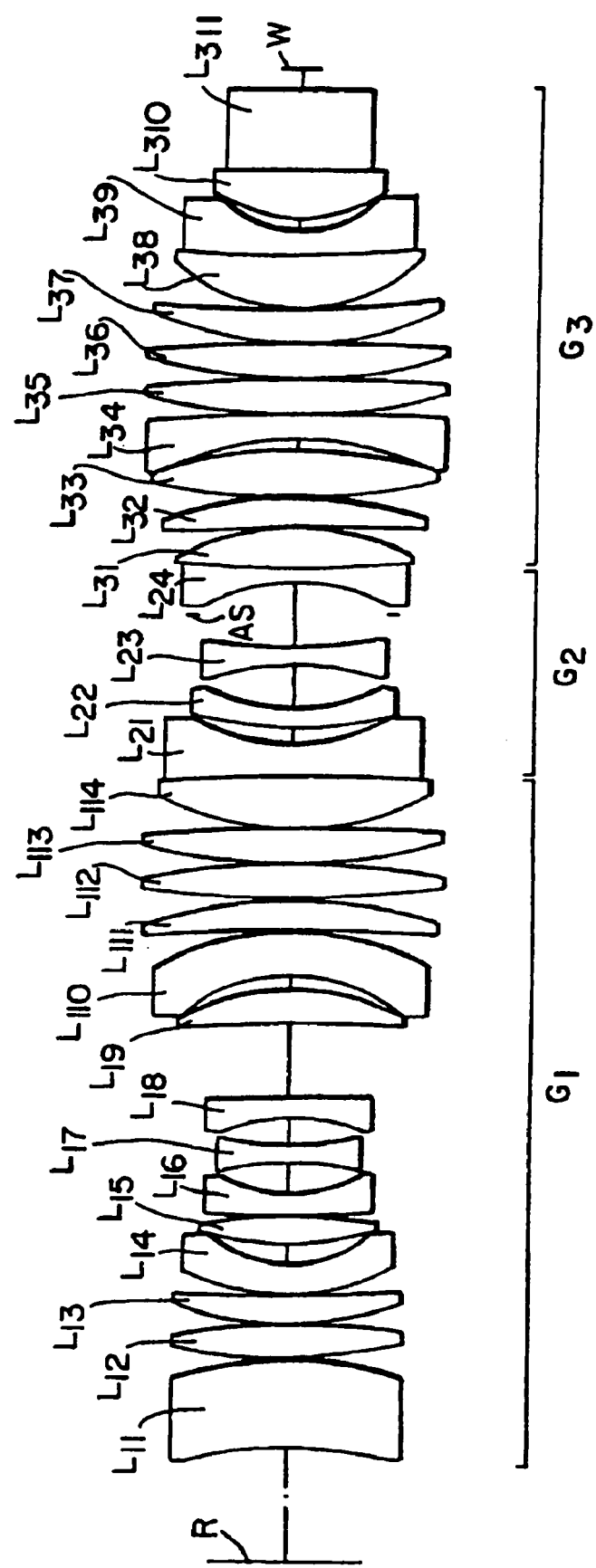
FIG. 26 is a schematic block diagram showing another example of a projection optical system.

On the other hand, in the case where the exposure light source is an ArF excimer laser, a projection optical system having, for example, the lens configuration shown in FIG. 26 can be suitably used.

In FIG. 26, from the side of a reticle R as a first object, a first lens group G1 having a positive power, a second lens group G2 having a positive power, and a third lens group G3 having a negative power are formed in this order. The projection optical system is approximately telecentric on the object side (reticle R side) and the image side (wafer W side), and has a zoom out magnification. This projection optical system has an NA of 0.6 and a projection magnification is ¼, and the diameter of the exposure region on the image side is 30.6.

In the case where a projection optical system has the lens configuration shown in FIG. 26, in general, material for each lens is appropriately selected in order to compensate chromatic aberration. For example, quartz glass is used as material for the fourteen lenses L11 to L114 constituting the first lens group G1, quartz glass is used as material for four lenses L21 to L24 constituting the second lens group G2, calcium fluoride crystals are used as material for six lenses out of the eleven lenses L31 to L311 constituting the third lens group G3, and quartz glass is used as material for the other five lenses. Thus, compensation for chromatic aberration can be suitably performed.

Note that, in an optical member used heretofore, even if birefringence has a-preferable value within 2 nm/cm anywhere inside an optical effective diameter, when lens machining and coating are performed and when an optical system of a stepper projection lens having an NA of 0.8, which is significantly influenced by oblique incident light, is assembled, performance as a projection lens cannot be obtained.

On the other hand, in the optical member manufacturing method of the present invention, a position reference line which is parallel to an optical axis is drawn at a predetermined position on the side surface of an optical member. Then, the position reference line is set at the front of a plane orientation measurement apparatus, to measure crystal plane orientations by the Laue method. Thereafter, based on the obtained crystal plane orientations, an optical material is cut out with accuracy where the deviation angle between the cutting plane and the crystal plane orientation is within 3°. Furthermore, also when the optical material is ground or coated, crystal plane orientations are controlled. When an optical system is fabricated using the optical members thus obtained, the optical members are arranged so as to have the relationships shown in FIGS. 2A and 2B, FIGS. 3A and 3B, and FIGS. 4A to 4D, thus making it possible to reduce the influence of intrinsic birefringence of a fluoride crystal and to achieve high level imaging performance.

Furthermore, in the present invention, the influence of residual birefringence is compensated by inserting into an optical system crystals, such as quartz glass, calcium fluoride, or barium fluoride, which have been manufactured in such a manner that birefringence distribution is controlled to cancel out the birefringence of calcium fluoride, after the birefringence distribution in these crystals has been measured. Thus, optical performance can be further improved. It is needless to say that crystal plane orientations are controlled also in this case.

As described above, according to the present invention, crystal plane orientations for each lens are more accurately controlled, and combining optical members having various plane orientations are combined, whereby it is possible to reduce the influence of intrinsic birefringence of a fluoride crystal on optical system performance to the minimum. Accordingly, the optical member obtained by the present invention is very effective as an important element for ensuring performance of an optical system.

EXAMPLE

Hereinafter, based on examples and comparative examples, the present invention will be described more specifically. However, the present invention is not limited to the following examples at all.

Example 1

<Calcium Fluoride Single Crystal Growth Process>

Using the apparatus shown in FIGS. 7A to 7C, an ingot of a calcium fluoride single crystal was manufactured by the Bridgeman method. As raw material, high purity raw material made by chemical synthesis was used. The high purity raw material was filled into carbon crucibles having the shape of a pencil (φ300 mm). These crucibles were stacked in a growth furnace, and the inside of the growth apparatus was maintained in a vacuum atmosphere of $10^{-3}$ to $10^{-4}$ Pa. Next, the temperature in the growth furnace was raised over the melting point of fluorite to melt the raw material, and then the temperature in the growth furnace was cooled down to the room temperature. In this case, in order to reduce the temporal variation of the temperature in the growth furnace, PID control was performed. Moreover, lead fluoride was added as fluorinating agent to powder raw material. Moreover, a seed crystal was put into the tip portion of the circular cone portion which is located at the lower end of each crucible, thus controlling plane orientations of crystal growth.

The semi-melting product thus obtained was transferred to the crystal growth furnace, and the temperature was raised to the melting temperature again. Then, the crucibles were pulled down at a speed of 0.1 to 5 mm/h, thus gradually crystallizing the semi-melting product from the lower portion of each crucible (crystal growth process). When the melt was crystallized to the uppermost portion, the crystal growth was stopped. Then, gradual cooling was performed so that the grown crystal (ingot) do not crack. The fact that the temperature in the growth furnace had fallen to the room temperature was confirmed. Thereafter, the growth furnace is opened to the atmosphere, and the ingot having the shape of a pencil of φ290 mm×t300 mm was taken out.

<Plane Orientation Measurement Process>

For the ingot of a calcium fluoride single crystal thus obtained, a portion on the side surface of the ingot which had faced the front inside the furnace was ground and smoothed with a wire brush, and further, a straight line was drawn with a glass pencil, thus providing a position reference line.

Next, test pieces each having a thickness of 30 mm and a diameter of 290 mm were cut out from the cone and top portions of the ingot. For these two test pieces, using the apparatus shown in FIG. 8, the crystal plane orientations for the {111}, {100}, and {110} planes were measured by the Laue method (side reflection method). From the plane orientations obtained for the test pieces, crystal plane orientations of the ingot main body were decided. The positional relationship among the ingot main body and the two test pieces was checked based on the above-described position reference line.

Here, in the coordinate system in which the innermost side of the sample stage is set as the direction of the x axis and the vertical downward direction of the sample stage is set as the direction of the z axis, α denotes the angle between the z axis and the [111] axis, and β denotes the angle of a line, which is the projection of the [111] axis on the measured surface, counterclockwise from the +x direction of the x axis. Then, the plane orientation angles obtained by the above-described measurement were α=5° and β=85° (refer to FIG. 9).

The ingot main body from which the cone and top portions had been cut off underwent rounding machining, and the cylindrical surface portion was made a surface equivalent to one finished with smoothing. In addition to the observation from the surface of smoothed surface, an internal observation made in a darkroom after refractive index matching oil has been applied upon the smoothed surface, an observation of stress concentration or the like on an interface with a cross nicol optical system were performed. Thus, the states of a sub-grain boundary and a polycrystal and the positions of the interfaces thereof were checked as well as the bubbles and inclusions and foreign substances. In the ingot of the present example, the plane orientations of the cone and top portions coincided without contradiction. Moreover, a sub-grain boundary was not observed in the observation of the ingot surface, and a boundary line of a polycrystal was not observed inside the ingot. Accordingly, the fact that a single crystal had been obtained was confirmed.

<Cutout Process>

Based on α and β obtained in the above-described plane orientation measurement process, a cutting direction for the ingot was decided, and two cylindrical materials having dimensions of φ260 mm×t50 mm and φ200 mm×t60 mm were cut out so that circular-shaped planes are parallel to {111} planes. At this time, marking was performed to clarify the relationship between crystal plane orientations and the position reference line added in the plan direction measurement process. This marking was maintained through the subsequent processes, thereby controlling {111} and {100} planes in an optical member (final part).

For the optical member thus obtained, plane orientation measurement by the Laue method was performed, thus confirming that there were no sub-boundary and no twin crystal. Crystal plane orientations of the obtained material coincided with the plane orientations of the ingot within a range of ±3°.

Then, after annealing for improving quality, the value of birefringence was automatically measured. The birefringence in the {111} plane direction in the optical material before annealing was 5 nm/cm or more, but the birefringence was reduced to 3 nm/cm or less after annealing. Note that the measurement of birefringence was performed using light having a wavelength of 633 nm.

Moreover, for the obtained optical material, when crystal plane orientations were measured every 60° outside the optical effective diameter by the Laue method, these crystal plane orientations coincided with the crystal plane orientations of the ingot and the crystal plane orientations of the cylindrical material before annealing within a range of ±3°.

Example 2

<Optical Member Fabrication>

By a method similar to that of the example 1, a calcium fluoride single crystal ingot was grown, and the crystal plane orientations for the {111}, {100}, and {110} planes of the ingot were measured.

Next, from this ingot, a plurality of cylindrical materials were cut out so that two {111} planes constitute upper and lower flat surfaces. A reference line was drawn by a pencil, parallel to the optical axis at an arbitrary position on the side surface by a pencil, and was set at the front of the plane orientation measurement apparatus. Then, crystal plane orientations of the optical material were measured by the Laue method. At this time, lines which were the projections of the [100], [010], and [001] axes on the measured surface had three-fold symmetry about the normal of the measured surface. A new reference line was drawn on the side surface of the material in the β angle direction of the projected line of the [100] axis among these axes, and the previous arbitrary reference line was erased with an eraser.

Next, the new reference line was set at the front of the plane orientation measurement apparatus, thus measuring crystal plane orientations by the Laue method again. At this time, out of plane orientation angles for (010), (100), and (001), each β angle is any one of 60°, 180°, and 300°. The position of the new reference line corresponded to the position of 180°.

While the <100> axes was being controlled in this way, the optical material was ground and coated, thus obtaining optical members.

<Fabrication of Projection Optical System for ArF Excimer Laser>

Figure 1:
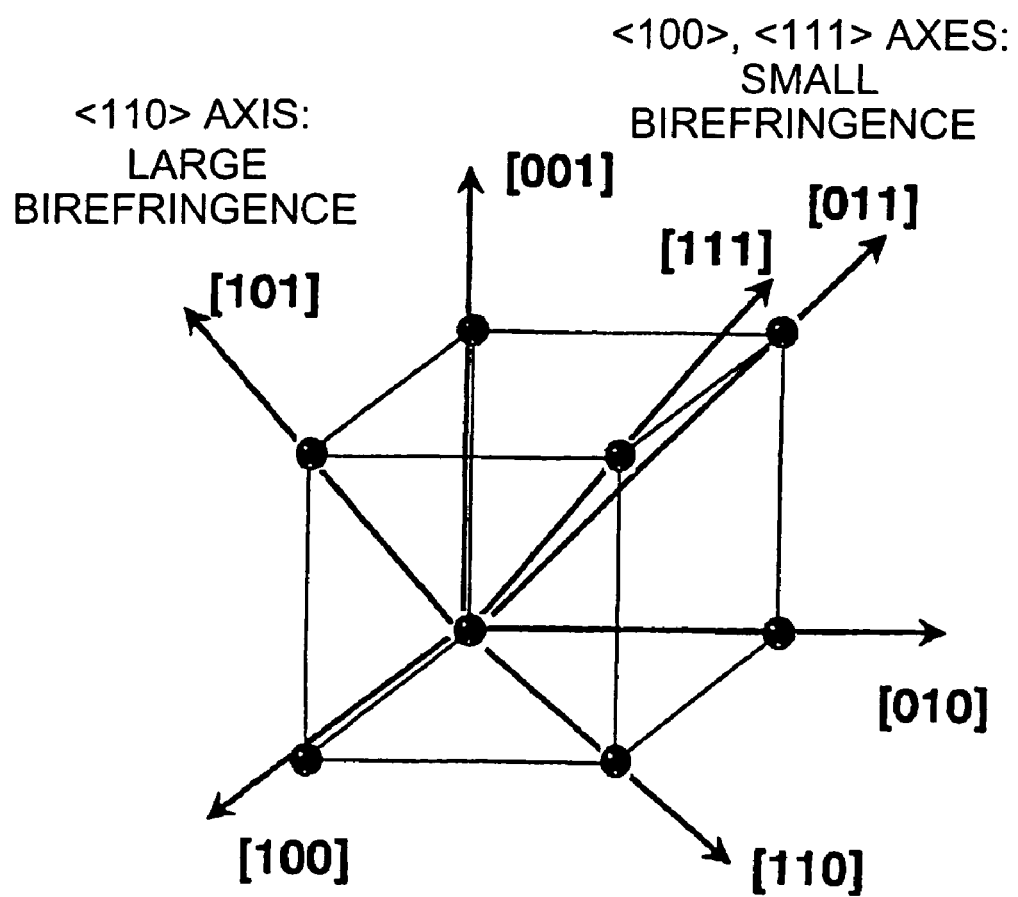
FIG. 1 is an explanatory view showing orientations of crystal planes in a fluoride single crystal, which is a cubic system crystal.
Figure 2A:
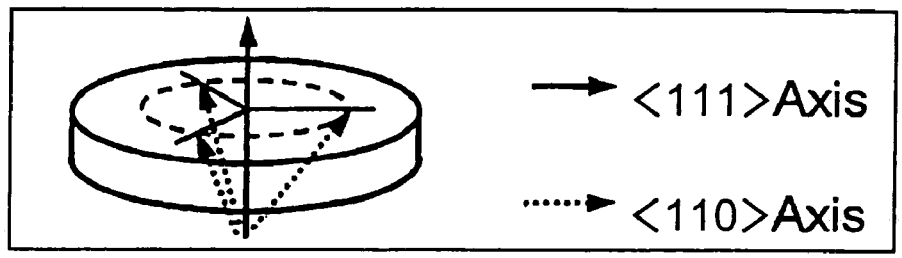
FIGS. 2A and 2B are respectively perspective views showing the relationship between the <111> and <110> axes when two optical members are combined, where solid and dotted arrows show the <111> and <110> axes, respectively.
Figure 2B:
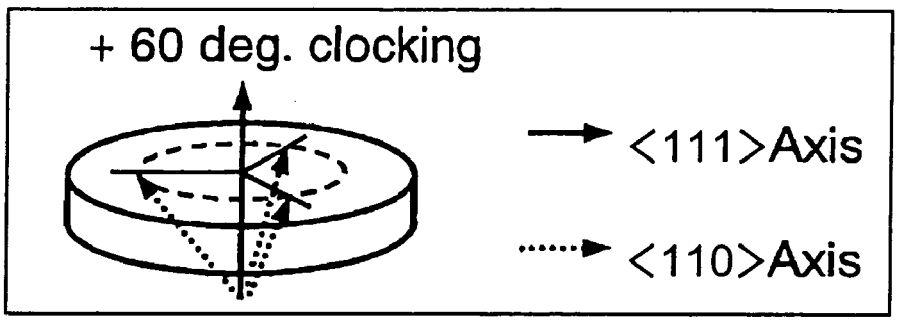
Figure 3A:
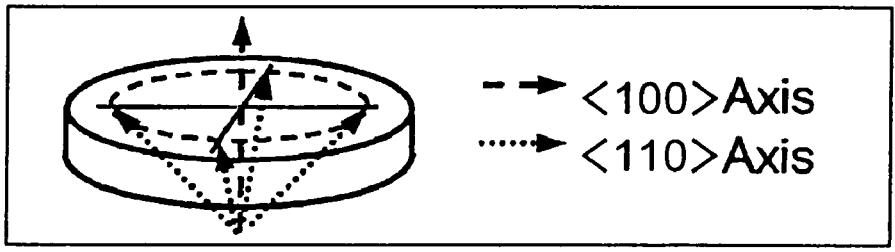
FIGS. 3A and 3B are respectively perspective views showing the relationship between the <100> and <110> axes when two optical members are combined, where broken and dotted arrows show the <100> and <110> axes, respectively.
Figure 3B:
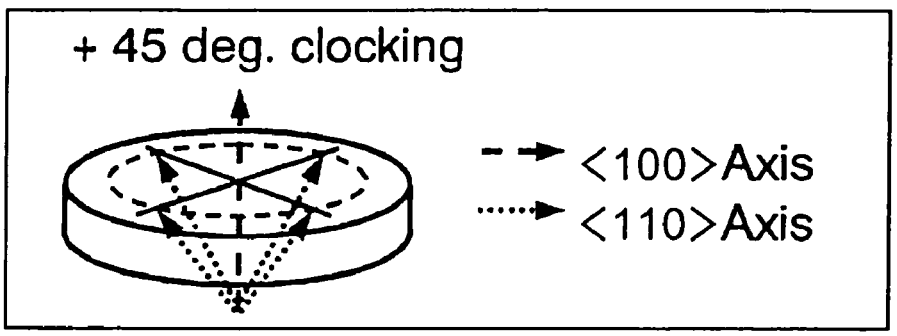
Figure 4A:
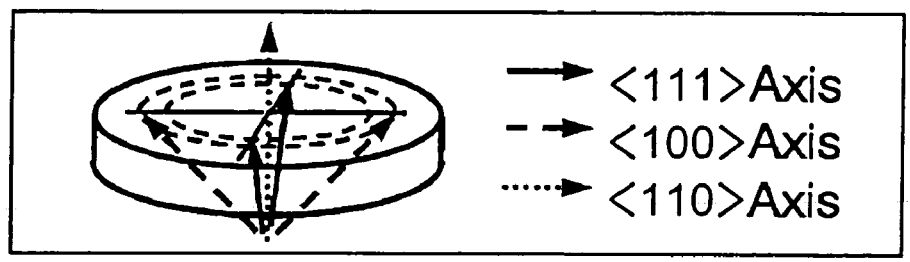
FIGS. 4A, 4B, 4C, and 4D are respectively perspective views showing the relationship among the <111>, <100>, and <110> axes when four optical members are combined, where solid, broken, and dotted arrows show the <111>, <100>, and <110> axes, respectively.
Figure 4B:
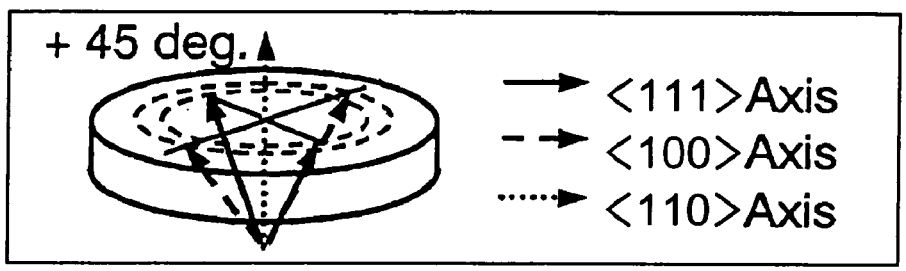
Figure 4C:
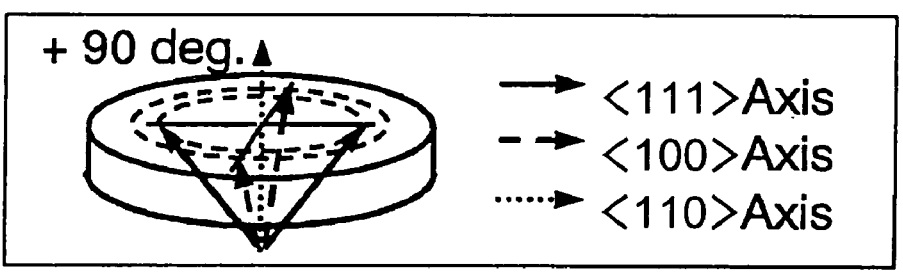
Figure 4D:
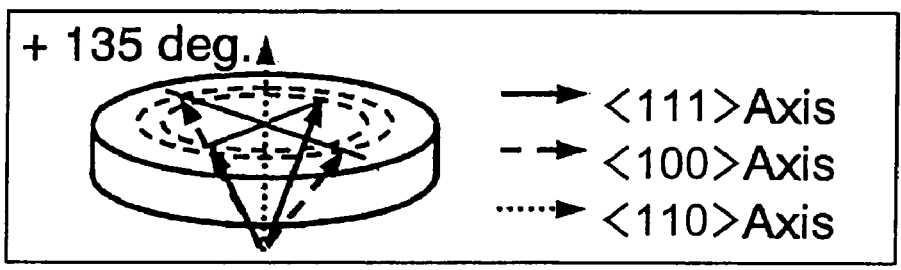

The obtained optical members were used as lenses, and the projection optical system shown in FIG. 26 was fabricated. In this projection optical system, the optical members obtained in the present example were used as the lenses L31, L33, L35, L37, L38, L310 out of the eleven lenses L31 to L311 constituting the third lens group G3. As shown in FIGS. 2A and 2B, these optical members were arranged so that the orientation of a {110} plane of each-lens might deviate from one another by 60°.

For the optical system thus obtained, the Strehl value due to birefringence distribution when using an ArF excimer laser was measured. The Strehl value of the optical system obtained in the present example was improved to 0.99, and the fact that the optical system has sufficient imaging performance for a projection optical system has been confirmed.

Comparative Example 1

<Optical Member Fabrication>

Similar to the example 1, an ingot of a calcium fluoride single crystal was fabricated.

Next, the ingot was lightly hit to be cleaved. An optical member was cut out along the cleavage plane ({111} plane), and was ground and coated similarly to the example 2, thus obtaining optical members.

<Fabrication of Projection Optical System for ArF Excimer Laser>

Next, the obtained optical members were used as lenses, and the optical system shown in FIG. 26 was fabricated. Note that the present comparative example is the same as the example 2 in that the optical members obtained in the present comparative example were used as the lenses L31, L33, L35, L37, L38, L310 out of the eleven lenses L31 to L311 constituting the third lens group G3 in FIG. 26. However, when these lenses were arranged, a {111} plane of each lens was just aligned with the optical axis, and the other crystal plane orientations were not considered. For the projection optical system thus obtained, the Strehl value was measured similarly to the example 2. The obtained Strehl value was 0.91, which is insufficient for the performance of a projection optical system.

Example 3

<Optical Member Fabrication>

Using a method similar to that of the example 1, an ingot of a calcium fluoride single crystal was grown, and the crystal plane orientations for {111}, {100}, and {110} planes of the ingot were measured.

From this ingot, a plurality of cylindrical materials were cut out so that two {111} planes constitute upper and lower flat surfaces. At this time, crystal plane orientations of the material were measured, and the material was machined so that {111} planes, {100} planes, and {110} planes constitute respectively two parallel flat surfaces, thus obtaining an optical member. For the obtained optical member, the fact that the deviation in plane orientations from optical design values is within 3° has been confirmed.

<Fabrication of Projection Optical System for $F_2$ Laser>

Next, the obtained optical members were used as lenses and prisms, and the projection optical system shown in FIG. 25 was fabricated. Specifically, in the projection optical system shown in FIG. 25, the optical members of the present example were used for all lenses and prisms. In addition, when these optical members were arranged, in the case of members of which <111> axes were aligned with the optical axis, two lenses of which <110> axes were rotated around the optical axis by 60° were combined to be arranged, thus counteracting birefringence of these optical members. Moreover, in the case of members of which <100> axes were aligned with the optical axis, two lenses of which <110> axes were rotated around the optical axis by 45° were combined to be arranged, thus counteracting birefringence of these optical members. Further, in the case of members of which <110> axes were aligned with the optical axis, four lenses of which <111> and <100> axes were respectively rotated around the optical axis by 45°, 90°, and 135° were combined to be arranged, thus counteracting birefringence of these optical members.

For the projection optical system thus obtained, the Strehl value when using a $F_2$ laser was measured. The Strehl value of the optical system obtained in the present example was improved to 0.92, and the fact that the optical system has sufficient imaging performance for a projection optical system has been confirmed.

Comparative Example 2

<Optical Member Fabrication>

Similar to the example 1, an ingot of a calcium fluoride single crystal was fabricated.

Next, the ingot was lightly hit to be cleaved. An optical material was cut out along the cleavage plane ({111} plane), and then ground and coated similarly to the example 2, thus obtaining an optical member.

<Fabrication of Projection Optical System for $F_2$ Laser>

Next, the obtained optical members were used as lenses and prisms, and the optical system shown in FIG. 25 was fabricated. Note that the present comparative example is the same as the example 3 in that the optical members obtained in the present comparative example were used for all lenses and prisms. However, when these lenses were arranged, a {111} axis of each lens was just aligned with the optical axis, and the other crystal plane orientations were not considered.

For the projection optical system thus obtained, the Strehl value was measured similarly to the example 3. The obtained Strehl value was 0.56, which is insufficient for the performance of a projection optical system.

INDUSTRIAL APPLICABILITY

As described above, according to the optical member manufacturing method of the present invention, it is possible to obtain with ease and certainty an optical member in which not only a crystal plane orientation coinciding with the optical axis direction but also other crystal plane directions are able to be controlled. In the case where the optical members obtained by the present invention are used to fabricate an optical system, crystal plane orientations among the optical members are arranged so as to have a predetermined positional relationship as described above. Thus, the influence of intrinsic birefringence of a fluoride crystal is reduced, and imaging performance in the optical system can be sufficiently improved. Moreover, by controlling crystal plane orientations for each optical member in this way, it is possible to combine optical members having various plane orientations to assemble an optical system, thus improving the degree of freedom in design.

What is claimed is:

1. A method of manufacturing an optical member, comprising:
   a growth step of growing an ingot of a fluoride crystal;
   a plane orientation measurement step of measuring two or more crystal plane orientations of the ingot;
   a cutout step of cutting out an optical material from the ingot along any one of the crystal plane orientations obtained in the plane orientation measurement step; and
   a machining step of performing machining processing on the optical material to obtain an optical member.

2. The method of manufacturing an optical member according to claim 1,
   wherein the measured crystal plane orientations are two or more selected from {111}, {100}, and {110} planes.

3. The method of manufacturing an optical member according to claim 1,
   wherein a reference line for the crystal plane orientations is provided on the ingot in the plane orientation measurement step, and the optical material is cut out from the ingot based on the reference line in the cutout step.

4. The method of manufacturing an optical member according to claim 1, wherein the plane orientation measurement step comprises:
measuring two or more crystal plane orientations of a test piece portion that is obtained by cutting off any one of top and cone portions of the ingot; and
determining the crystal plane orientations of the ingot from the measured crystal plane orientations of the test piece portion.

5. The method of manufacturing an optical member according to claim 1,
wherein the plane orientation measurement step utilizes a Laue method in which X-rays are applied to a subject to measure crystal plane orientations.

6. The method of manufacturing an optical member according to claim 5,
wherein the Laue method uses a side reflection method.

7. The method of manufacturing an optical member according to claim 1,
wherein a deviation angle of the optical member from a crystal plane orientation in the cutout step is 3° or less.

8. The method of manufacturing an optical member according to claim 1,
wherein the machining processing includes grinding.

9. A method of manufacturing an optical member, comprising:
a growth step of growing an ingot of a fluoride crystal;
a plane orientation measurement step of measuring two or more different crystal plane orientations of the ingot;
a cutout step of cutting out an optical material from the ingot along any one of the crystal plane orientations obtained in the plane orientation measurement step; and
a machining step of performing machining processing on the optical material to obtain an optical member,
wherein the optical material is marked prior to the machining step so as to keep track of the two or more different crystal plane orientations measured in the plane orientation measurement step.

10. The method of manufacturing an optical member according to claim 9,
wherein the measured crystal plane orientations are two or more selected from {111}, {100}, and {110} planes.

11. The method of manufacturing an optical member according to claim 9,
wherein a reference line for the crystal plane orientations is provided on the ingot in the plane orientation measurement step, and the optical material is cut out from the ingot based on the reference line in the cutout step.

12. The method of manufacturing an optical member according to claim 9,
wherein the plane orientation measurement step comprises:
measuring two or more crystal plane orientations of a test piece portion that is obtained by cutting off any one of top and cone portions of the ingot; and
determining the crystal plane orientations of the ingot from the measured crystal plane orientations of the test piece portion.

13. The method of manufacturing an optical member according to claim 9,
wherein the plane orientation measurement step utilizes a Laue method in which X-rays are applied to a subject to measure crystal plane orientations.

14. The method of manufacturing an optical member according to claim 13,
wherein the Laue method uses a side reflection method.

15. The method of manufacturing an optical member according to claim 9,
wherein a deviation angle of the optical member from a crystal plane orientation in the cutout step is 3° or less.

16. The method of manufacturing an optical member according to claim 9,
wherein the machining processing includes grinding.

* * * * *